US006539510B1

(12) United States Patent
St. Pierre, Jr. et al.

(10) Patent No.: US 6,539,510 B1
(45) Date of Patent: Mar. 25, 2003

(54) INTERFACE BOARD FOR RECEIVING MODULAR INTERFACE CARDS

(75) Inventors: Donald H. St. Pierre, Jr., Campbell, CA (US); Edwin W. Resler, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 717 days.

(21) Appl. No.: 08/909,507

(22) Filed: Aug. 12, 1997

(51) Int. Cl.[7] ............................................... G01R 31/28
(52) U.S. Cl. ......................................... 714/727; 714/25
(58) Field of Search ........................... 371/22.32, 22.31, 371/22.34, 22.35, 25.1; 395/182.06, 183.01, 183.03, 183.07, 183.14, 183.19, 183.2; 364/489, 550; 324/765, 538; 714/25, 27, 30, 43, 725, 726, 727, 729

(56) References Cited

U.S. PATENT DOCUMENTS

| | | | |
|---|---|---|---|
| 5,228,045 A | | 7/1993 | Chiles ........................ 371/22.3 |
| 5,331,274 A | * | 7/1994 | Jarwala et al. ........... 324/158.1 |
| 5,343,478 A | | 8/1994 | James et al. ................ 371/22.3 |
| 5,355,369 A | | 10/1994 | Greenberger et al. ...... 371/22.3 |
| 5,428,624 A | | 6/1995 | Blair et al. ................. 371/22.3 |
| 5,428,750 A | | 6/1995 | Hsieh et al. ................ 395/275 |
| 5,483,518 A | | 1/1996 | Whetsal ........................ 370/13 |
| 5,498,972 A | * | 3/1996 | Haulin ........................ 324/765 |
| 5,544,309 A | * | 8/1996 | Chang et al. .......... 395/183.06 |
| 5,574,730 A | * | 11/1996 | End, III et al. ............. 371/22.1 |
| 5,581,541 A | * | 12/1996 | Whetsel ...................... 370/241 |
| 5,586,270 A | * | 12/1996 | Rotier et al. ................. 395/282 |
| 5,617,430 A | * | 4/1997 | Angelotti et al. ............. 371/27 |
| 5,640,521 A | * | 6/1997 | Whetsel ....................... 395/311 |
| 5,649,224 A | * | 7/1997 | Scheer ......................... 395/800 |
| 5,694,399 A | | 12/1997 | Jacobson et al. .......... 371/22.3 |
| 5,751,736 A | * | 5/1998 | Deroux-Dauphin et al. ..... 371/22.31 |

OTHER PUBLICATIONS

IEEE Computer Society, "IEEE Standard Test Access Port and Boundary–Scan Architecture" IEEE Std. 1149.1–1990, Copyright 1993 by the Institute of Electrical and Electronics Engineers, Inc. 345 East 47th Street, New York, NY 10017.

* cited by examiner

Primary Examiner—Nadeem Iqbal
(74) Attorney, Agent, or Firm—Jeanette S. Harms

(57) ABSTRACT

An interface board and inserted modular IC interface cards allows variable length boundary scan chains. The chain can be constructed of any type of programmable integrated circuit (IC) in any order. The interface board contains a plurality of JTAG interfaces that respectively mate with standard adapter interfaces located on the modular IC interface cards. If less than the maximum number of modular IC interface cards are inserted into the interface board, a terminator card is inserted into the standard interface following the last modular IC interface card of the chain. The last test data output signal of the chain is routed back to a connector of the interface board. The interface board includes an output cascade connector that couples with an input cascade connector of another interface board so that any number of interface boards can be cascaded in series to expand the boundary scan chain.

15 Claims, 31 Drawing Sheets

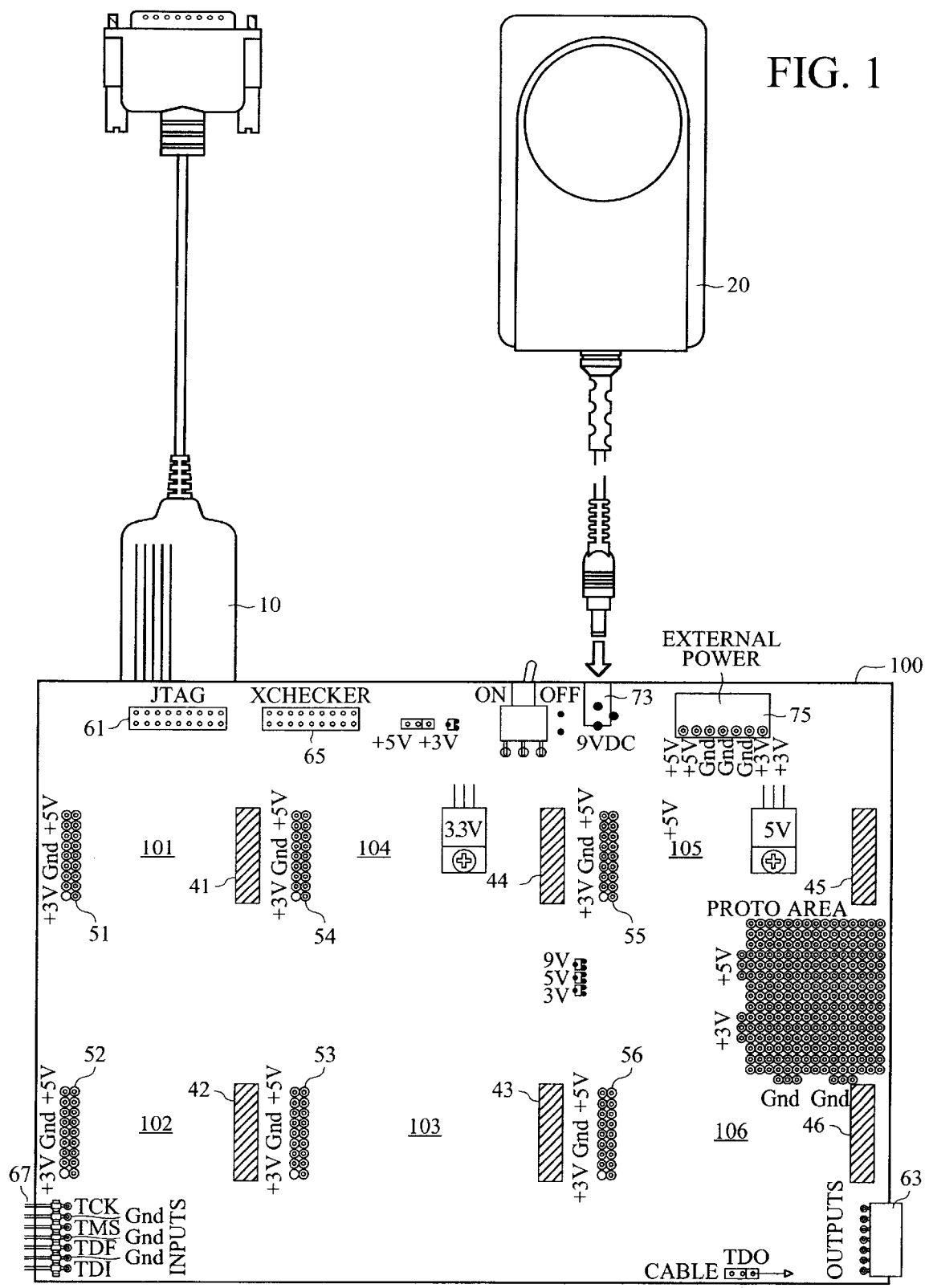

| FIG. 9A-1 | FIG. 9A-2 |
|---|---|
| FIG. 9A-3 | FIG. 9A-4 |

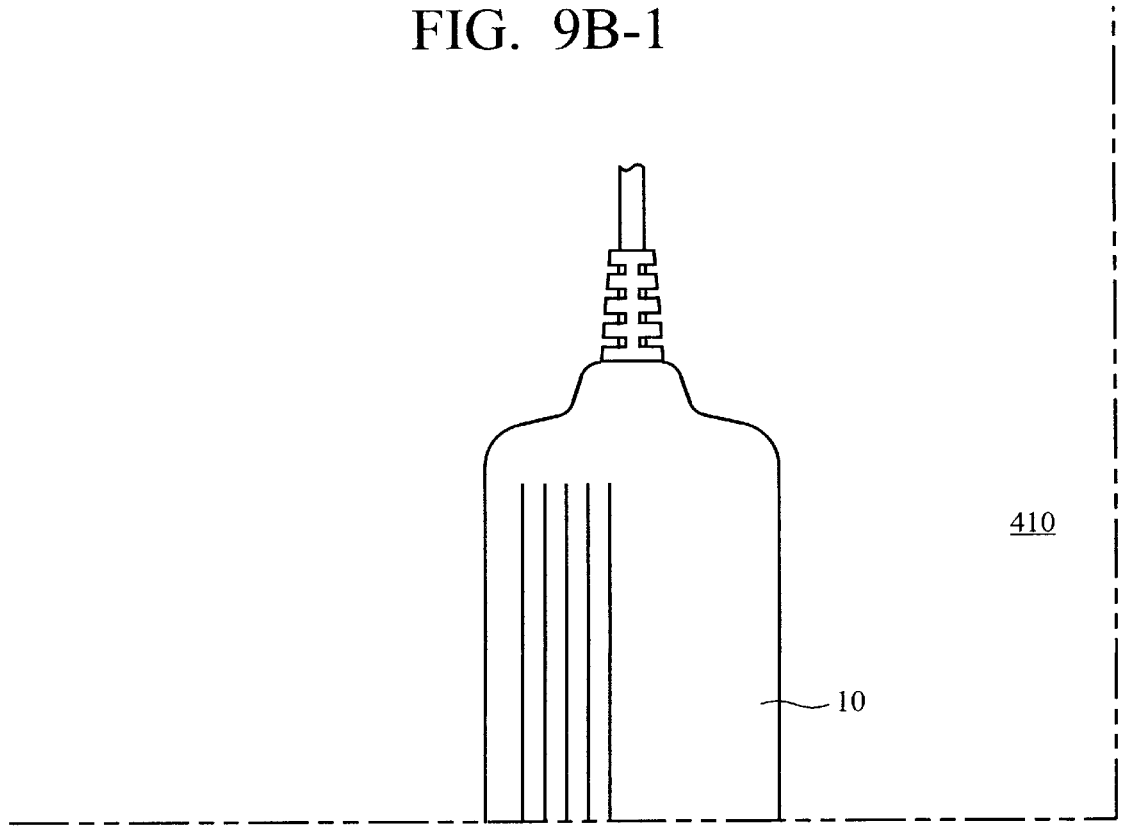

| FIG. 10A | FIG. 10B | FIG. 10C | FIG. 10D |
| FIG. 10E | FIG. 10F | FIG. 10G | FIG. 10H |

INTERFACE BOARD FOR RECEIVING MODULAR INTERFACE CARDS

BACKGROUND OF THE INVENTION

1. Field of the Invention

The present invention relates to the field of boundary scan interfaces in accordance with the IEEE 1149.1 standard developed by the Joint Test Action Group (JTAG), and more specifically to the equipment used in connection with circuits employing these boundary scans (hereinafter JTAG) interfaces.

2. Description of the Related Art

Electrically programmable logic devices (EPLDs), complex programmable logic devices (CPLDs), and field programmable gate arrays (FPGAs) are well known in the art. These devices can be programmed by integrated circuit designers to implement particular logic functions. To program an EPLD, CPLD, or FPGA, the device is typically connected to a computer system via an interface cable and the computer system is instructed to download program information into the device. The EPLD, CPLD, or FPGA (hereinafter the programmable logic device or PLD) retains this programming information in nonvolatile computer memory (e.g., flash memory, EEPROM, etc.) or in volatile computer memory (e.g., SRAM).

In the past, the JTAG interface was used primarily for testing devices that were soldered or otherwise fixed to a circuit board. Using the JTAG interface, instructions were sent from a computer system to the mounted devices to test for open circuits and short circuits associated with the pins of those devices. Recently, the JTAG interface has been used to program PLDs that are board mounted (i.e. in-system programmable (ISP) devices). To facilitate this programming, multiple PLDs are coupled in a chain in accordance with the IEEE 1149.1 boundary scan standard. The first device in the JTAG chain, which is coupled to the programming computer via a JTAG interface cable, can be programmed and then put into a bypass mode so that other downstream devices in the JTAG chain are programmed sequentially.

To accomplish this programming, the ISP software includes complex software routines to control the programming order of the PLDs in the JTAG chain. Thus, the programming data is written into the JTAG chain using the placement order of the PLDs. However, the designer often does not have access to the physical embodiment of the JTAG chain that is being programmed, thereby preventing the ISP software from being tested and verified in conjunction with the JTAG chain. Alternatively, the designer has access to the JTAG chain, but wants to test the JTAG chain independently from the overall electronic design.

To solve this problem in the past, the physical JTAG chain was constructed using prototype material, e.g. wirewrap and prototype circuit boards (protoboards). The designer then used the physical JTAG chain to test the ISP software. However, this prototype construction is tedious, complex, and error-prone, thereby making the process disadvantageous for small JTAG chains and entirely impractical for large JTAG chains. Therefore, a need exists for a structure that facilitates testing ISP software and other aspects pertinent to a physical JTAG chain.

SUMMARY OF THE INVENTION

Accordingly, the present invention provides a structure that allows any number of PLDs, of any type and in any order, to be coupled together into a physical JTAG chain. Thus, the present invention facilitates the quick and easy construction of custom JTAG chains that can be used for a broad range of diagnostic purposes. One such diagnostic purpose is to test software designed for ISP PLDs that conform to the IEEE 1149.1 boundary scan standard.

In accordance with the present invention, an interface board includes a plurality of JTAG interfaces for receiving one or more modular integrated circuit (IC) interface cards. Each card has a socket of a particular package type for receiving an IC of the same package type and a connector interface, coupled to the socket, for a removable coupling with one of the standard interfaces of the interface board.

The traces of the interface board provide certain JTAG signals, e.g. a test mode select (TMS) signal and a test clock (TCK) signal, to all of the JTAG interfaces (and thus to the modular IC interface cards and ICs in the JTAG chain) in parallel. Other JTAG signals, e.g. a test data input (TDI) signal and a test data output (TDO) signal, are routed through the ICs in series. Specifically, the TDO signal of one IC becomes the TDI signal of the next IC in the chain. The TDO signal of the last IC in the JTAG chain is provided as a test data final (TDF) signal from the interface board back to a cable (which communicates with the programming system). If less than the maximum number of modular IC interface cards are inserted into the interface board, a terminator card is inserted into the JTAG interface following the last modular IC interface card of the JTAG chain. This terminator card provides the TDF signal.

In accordance with one embodiment of the present invention, the interface board further includes an output cascade connector that can be coupled to an input cascade connector of another interface board. The cascade connectors facilitate the transfer of the JTAG signals between the interface boards. In this manner, any number of interface boards can be coupled in series to expand the size of the physical JTAG chain.

DETAILED DESCRIPTION OF THE DRAWINGS

Figures 1, 9A:
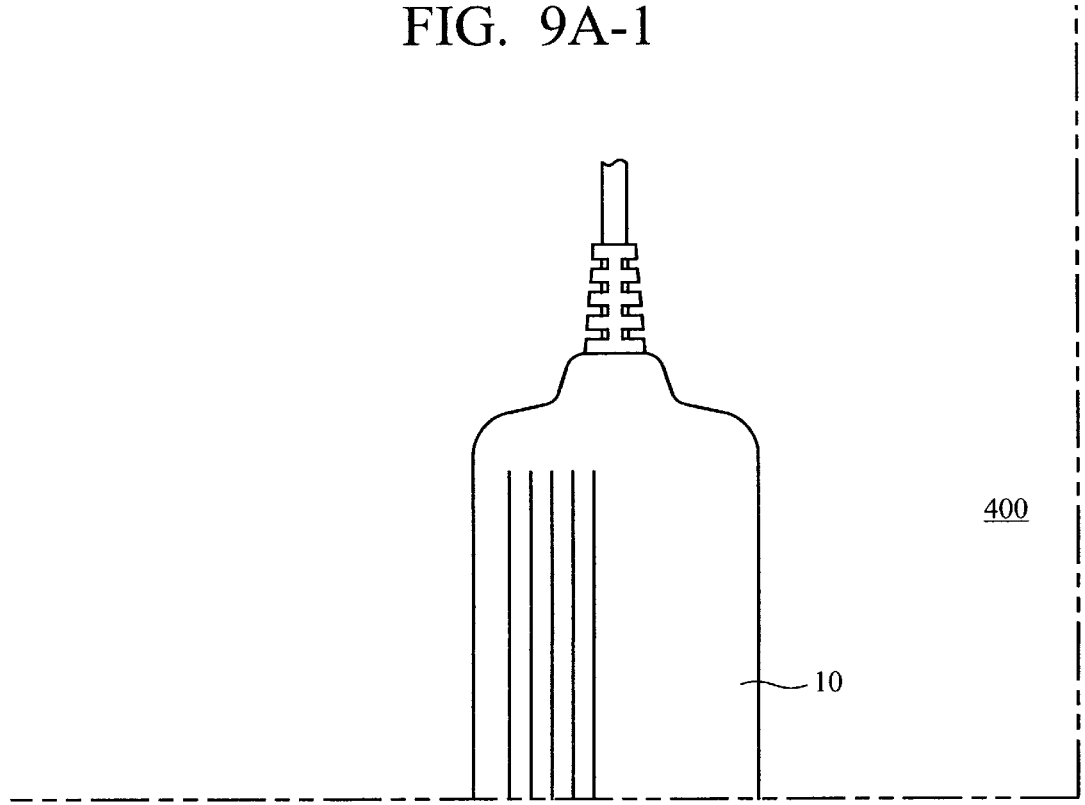
FIG. 1 illustrates a top view of an interface board of the present invention.
FIGS. 9A–9C show configurations of the interface board of the present invention.
Figures 2, 9A:
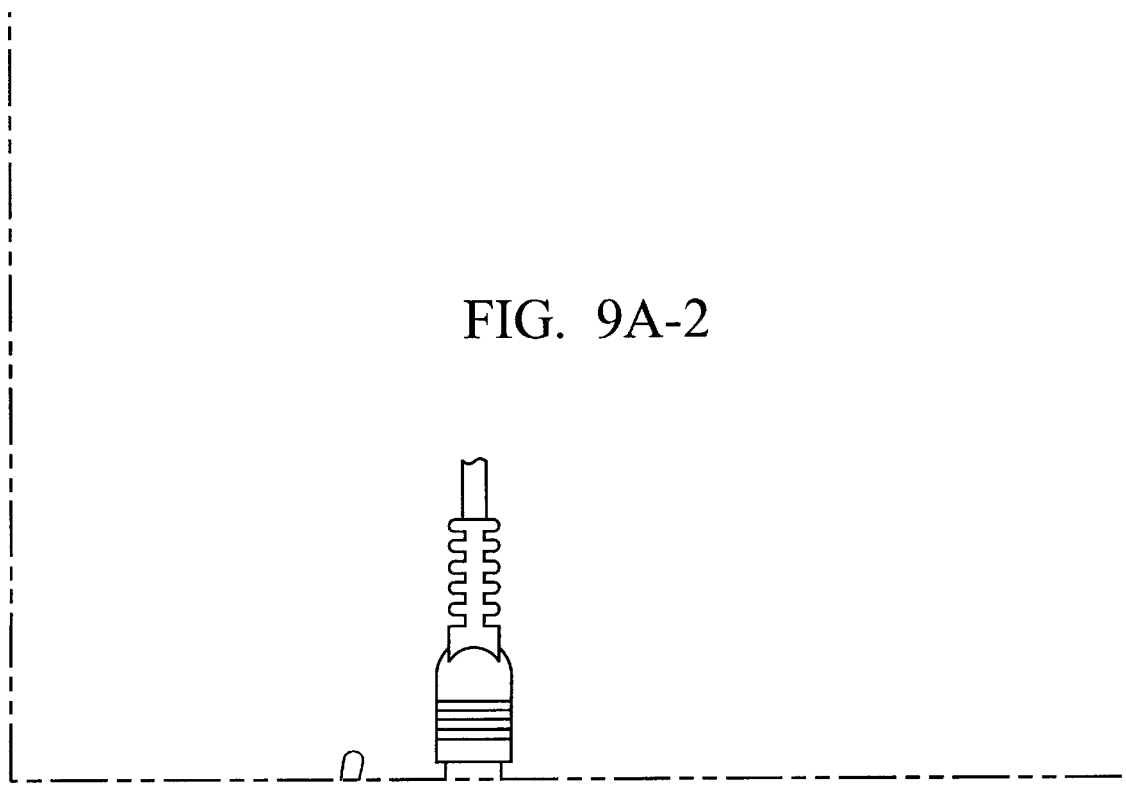
Figures 3, 9A:
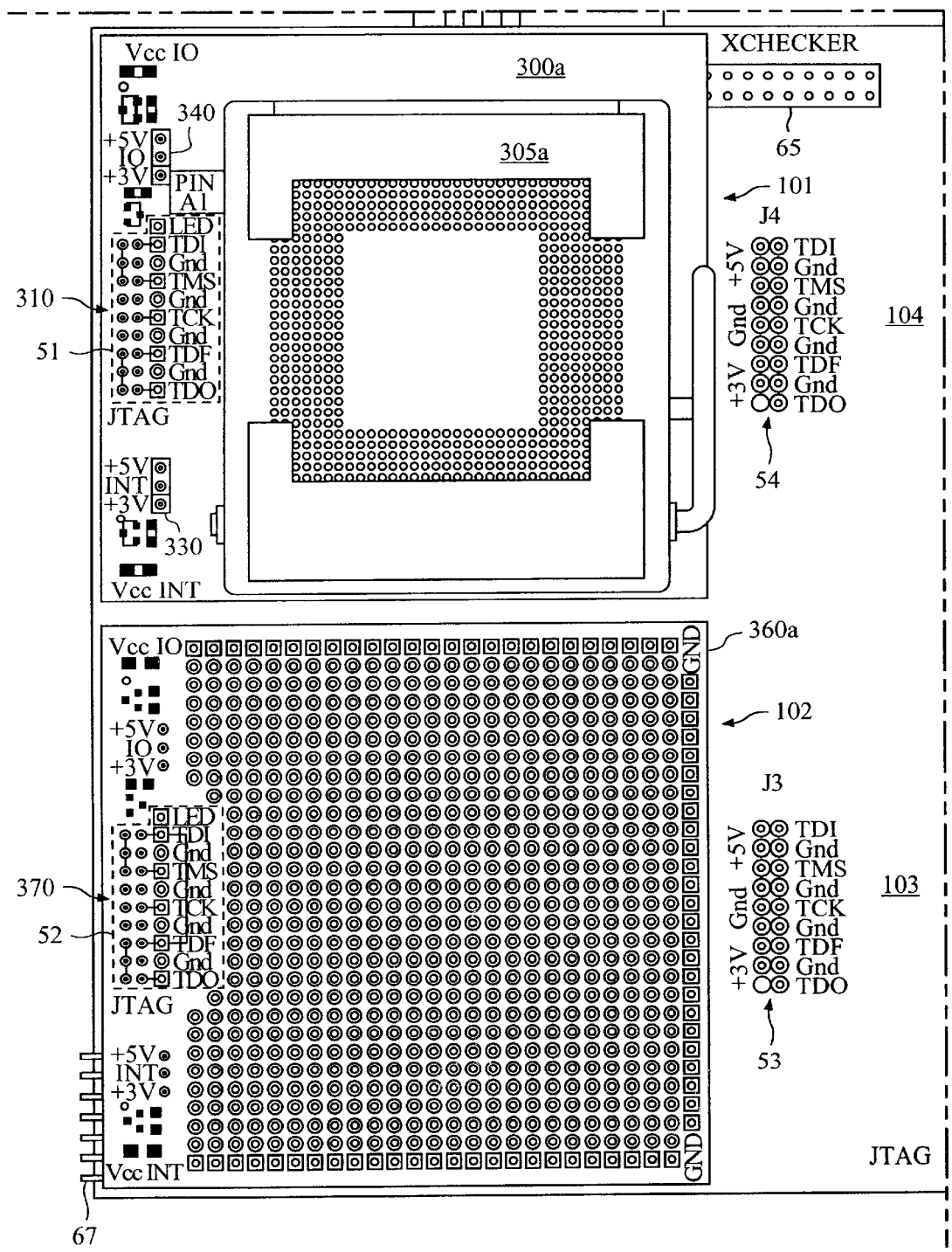
Figures 4, 9A:
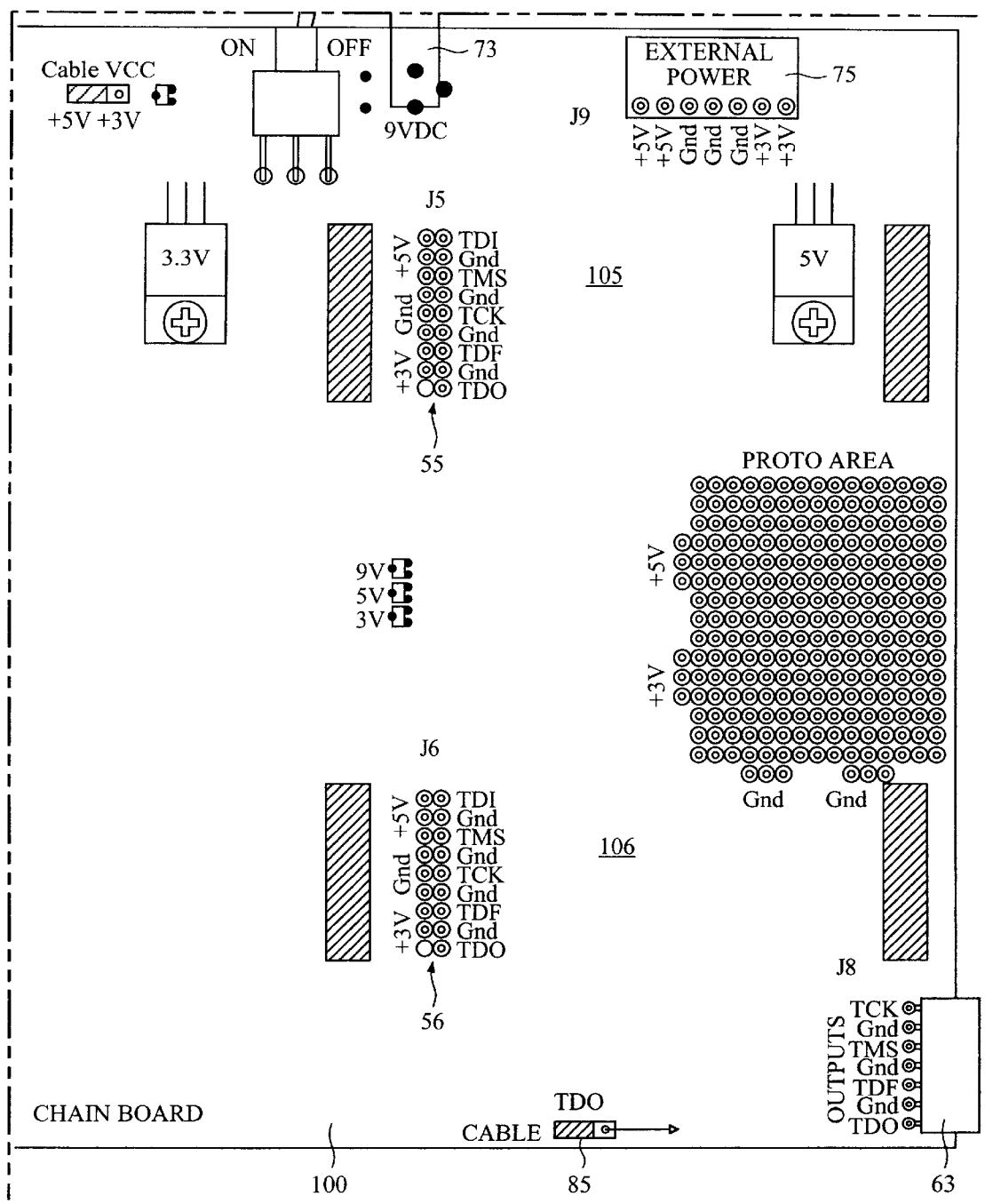

FIG. 1 illustrates a top view of an interface board 100 of the present invention which includes a plurality of JTAG interface stations 101–106, each station having one of JTAG interfaces 51–56. Note that providing six interface stations 101–106 is exemplary only and that other embodiments of interface board 100 have more or fewer interface stations. Each JTAG interface is designed to receive a modular IC interface card (explained in detail in reference to FIGS. 4, 5A, 5B, and 6) which includes a PLD (or any other JTAG-compliant packaged IC chip). In this embodiment, interface board 100 is wired to create a physical JTAG chain that starts at station 101 and ends at station 106. However, because any modular IC interface card can be connected to any JTAG interface, interface board 100 can support any ordering of devices within the JTAG chain.

A JTAG interface cable 10 is coupled to interface board 100 of the present invention via a cable connector 61 or 65 (both mounted on interface board 100). The other end of cable 10 is adapted to couple to a communication port (e.g., a serial or parallel port) of a standard computer system (not shown). Cable connector 61 is used when cable 10 is coupled to the parallel port of the computer system. On the other hand, cable connector 65 is used when cable 10 is coupled to the serial port of the computer system.

Note that if the serial port is used, cable 10 includes an additional processing unit. This processing unit is used to translate encoded instructions and data from the computer system to JTAG signals which are then transferred to interface board 100. One example of a processing unit which can be used with the present invention is described in U.S. Pat. No. 5,694,399, entitled "Processing Unit for Generating Signals for Communication with a Test Access Port," by N. Jacobson and A. Maraldo, and assigned to Xilinx, Inc. One commercially available cable including the additional processing unit, an XCHECKER cable, is provided by Xilinx, Inc.

Irrespective of the port used, JTAG conforming signals are provided to cable connector 61 or cable connector 65. In one embodiment, cable connectors 61 and 65 (in one example, standard 18 pin connectors) are positioned such that only one cable 10 can be coupled to board 100 at one time to supply and receive the JTAG signals.

In accordance with one embodiment of the present invention, interface board 100 is completely modular. Therefore, multiple interface boards 100 can be cascaded together, as needed, by connecting an input cascade connector 67 of a downstream interface board to an output cascade connector 63 of its immediate upstream interface board to create longer JTAG chains (explained in greater detail in reference to FIG. 10).

The Interface Board

Figure 2:
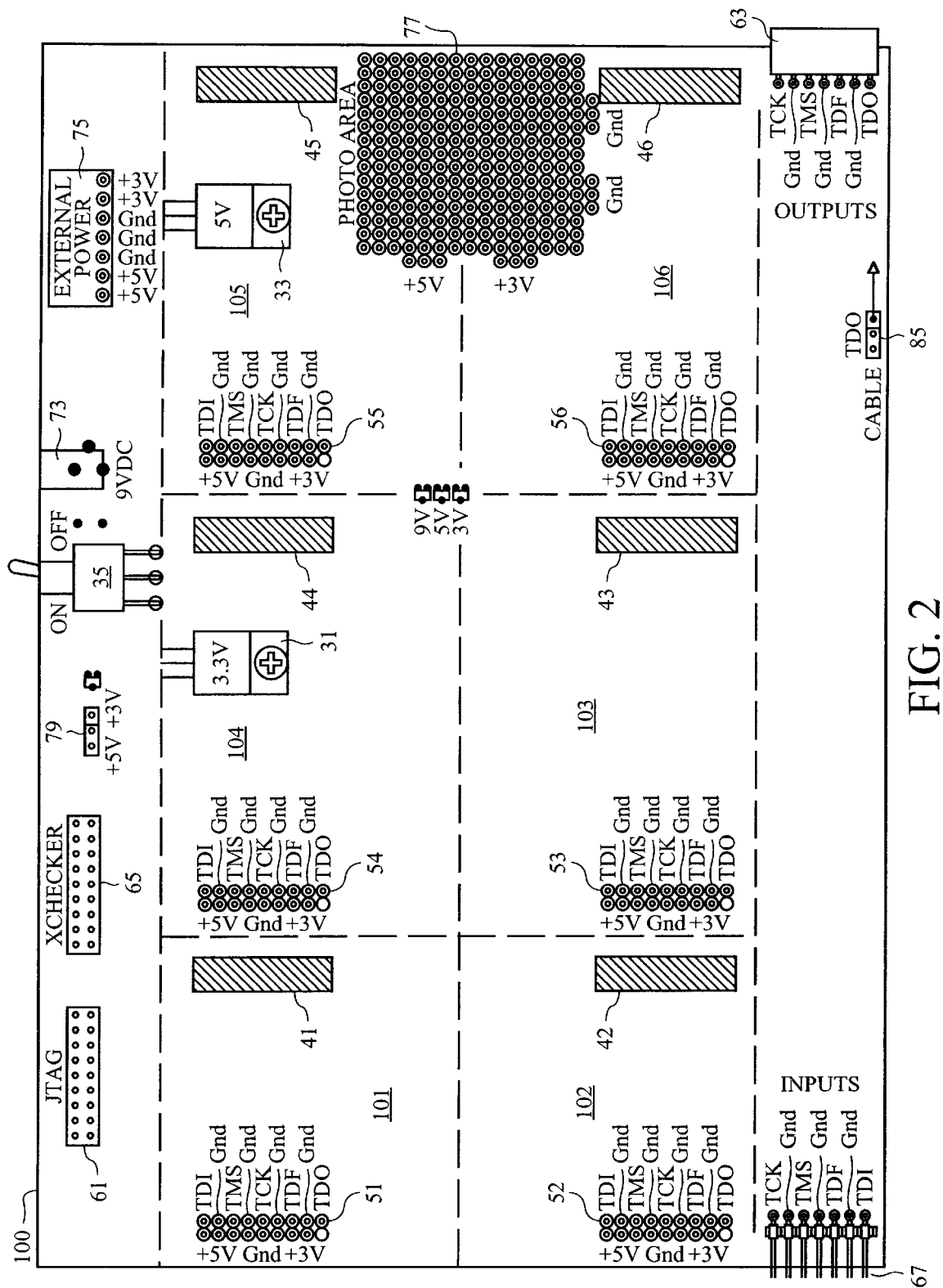
FIG. 2 illustrates a detailed top view of the interface board of the present invention including the multiple JTAG interface stations.

FIG. 2 illustrates another view of interface board 100 of the present invention including its multiple JTAG interface stations 101–106. Each interface station includes: (1) one of JTAG interfaces 51–56; (2) area for a modular IC interface card; (3) one of blocks 41–46 for supporting the modular IC interface card; and (4) connecting traces (shown and described in reference to FIGS. 3A–3D) used to couple JTAG interfaces 51–56 to form the physical JTAG chain.

In one embodiment, an optional prototype area 77 is provided to allow additional circuitry to be added to interface board 100. Examples of additional circuitry include chips having buffers that boost output signal strength if multiple interface boards are cascaded. This additional circuitry is typically coupled to interface board 100 by physical cuts to the traces of output cascade connector 63. Jumpers are then connected to the buffers, and from the buffers back to cascade connector 63.

FIGS. 3A, 3B, 3C, and 3D illustrate a schematic diagram of JTAG interfaces 51–56, cascade connectors 63 and 67, and cable connectors 61 and 65. Cable connector 61 (or cable connector 65) provides JTAG signals from the computer system (not shown) to interface board 100. For example, the TDI (test data input) signal is provided on line 61b; the TCK (test clock) signal is provided on line 61c; and the TMS (test mode select) signal is provided on line 61d. These lines, except line 61b, are coupled to all JTAG interfaces 51–56. Thus, the TCK and TMS signals are provided in parallel to JTAG interfaces 51–56. Line 61b, which provides the TDI signal, is coupled only to JTAG interface 51. The TDO (test data output) signal of JTAG interface 51 is provided as the TDI signal of JTAG interface 52 via line 210. A similar coupling is provided for JTAG interfaces 52–56. Thus, JTAG interfaces 51–56 are coupled in series using lines 210, 218, 212, 214, and 216.

In accordance with one embodiment of the present invention, interface board 100 receives power from either power supply port 73 or an external power connector 75. In one embodiment, power supply 20 (FIG. 1) provides 9V and ground to power supply port 73. A switch 35 provides the 9V supply to voltage regulators 31 and 33 which in turn provide 3.3V and 5V, respectively, to each of JTAG interfaces 51–56 in parallel. Voltage regulators 31 and 33 are coupled to ground (line 79a) via capacitors to stabilize their output voltage. The assignee of the present invention provides a power supply, commercially called the HW-130 universal power supply, but other power supplies of varying voltages, and provided by different manufacturers, can be used within the scope of the present invention.

Alternatively, external power connector 75 provides 3.3 volts and 5 volts to each of JTAG interfaces 51–56 in parallel. Typically, external power connector 75 is used if power supply 20 has another type of connector, i.e. a connector incompatible with power supply port 73, a greater current than that provided by power supply 20 is needed, or voltages other than 3.3 or 5V is required. Note that external power connector 75 can also provide ground to all the JTAG interfaces on line 61a.

Jumper 79 (FIG. 3B) controls the voltage level supplied to cable connectors 61 and 65. Specifically, if jumper 79 is switched to the left, 5V is supplied from line 33b to cable connectors 61 and 65 via line 226. If jumper 79 is switched to the right, 3.3V is supplied from line 31b to cable connectors 61 and 65.

Lines 61a, 61c, 61d, 61e, and 69 are coupled to output cascade connector 63. In this manner, if multiple interface boards 100 are cascaded, the appropriate JTAG signals (including TCK, TMS, and TDO) and ground would be provided to the next downstream interface board. Note that line 69 (which transfers the TDO signal to the next interface board 100) is coupled to line 61b (which would receive the transferred TDO signal as the cascaded TDI signal on the next interface board).

Modular IC Interface Cards

Figure 3A:
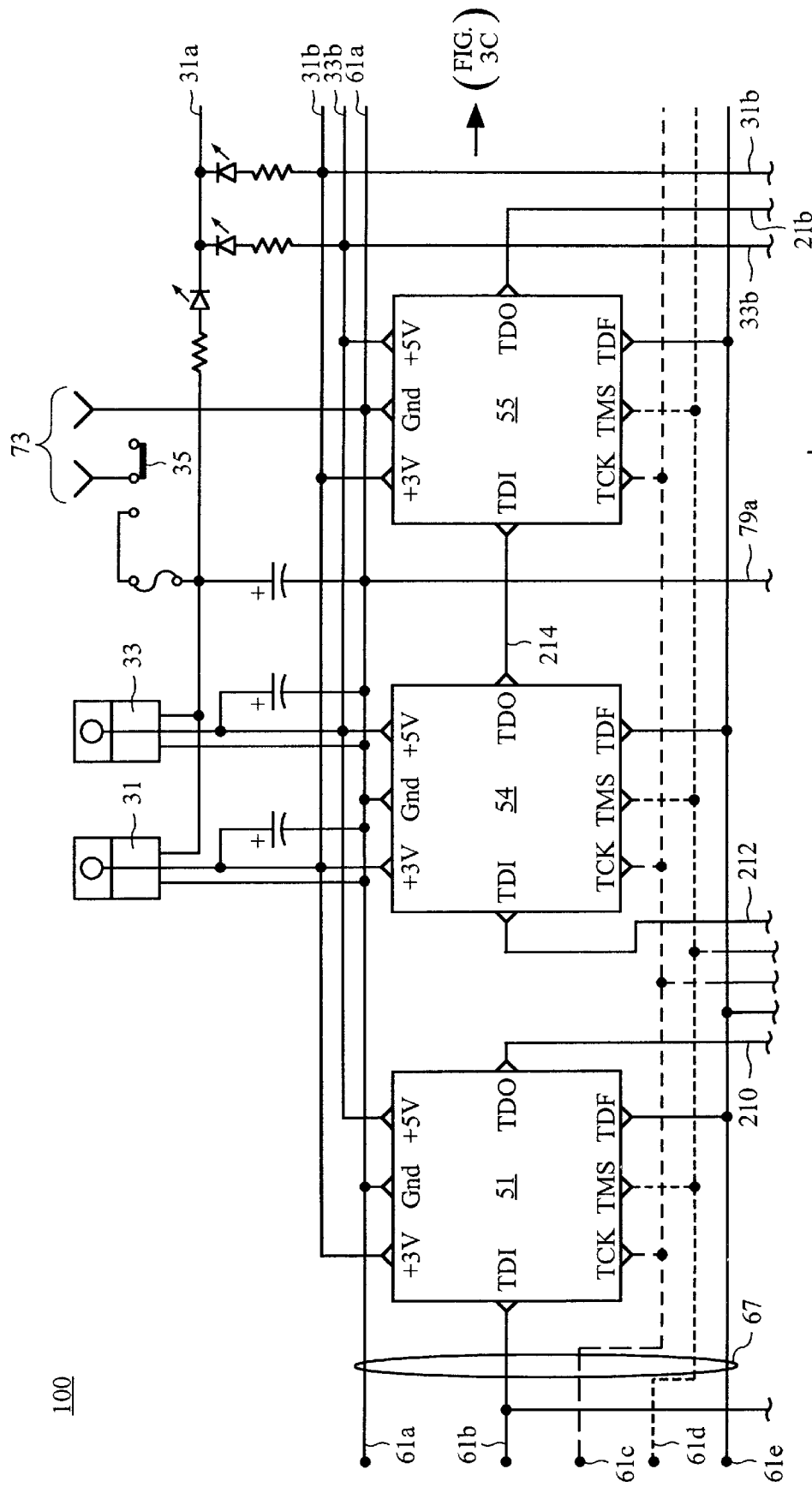
FIGS. 3A–3D illustrate a schematic diagram of one embodiment of the interface board of the present invention.
Figure 3B:
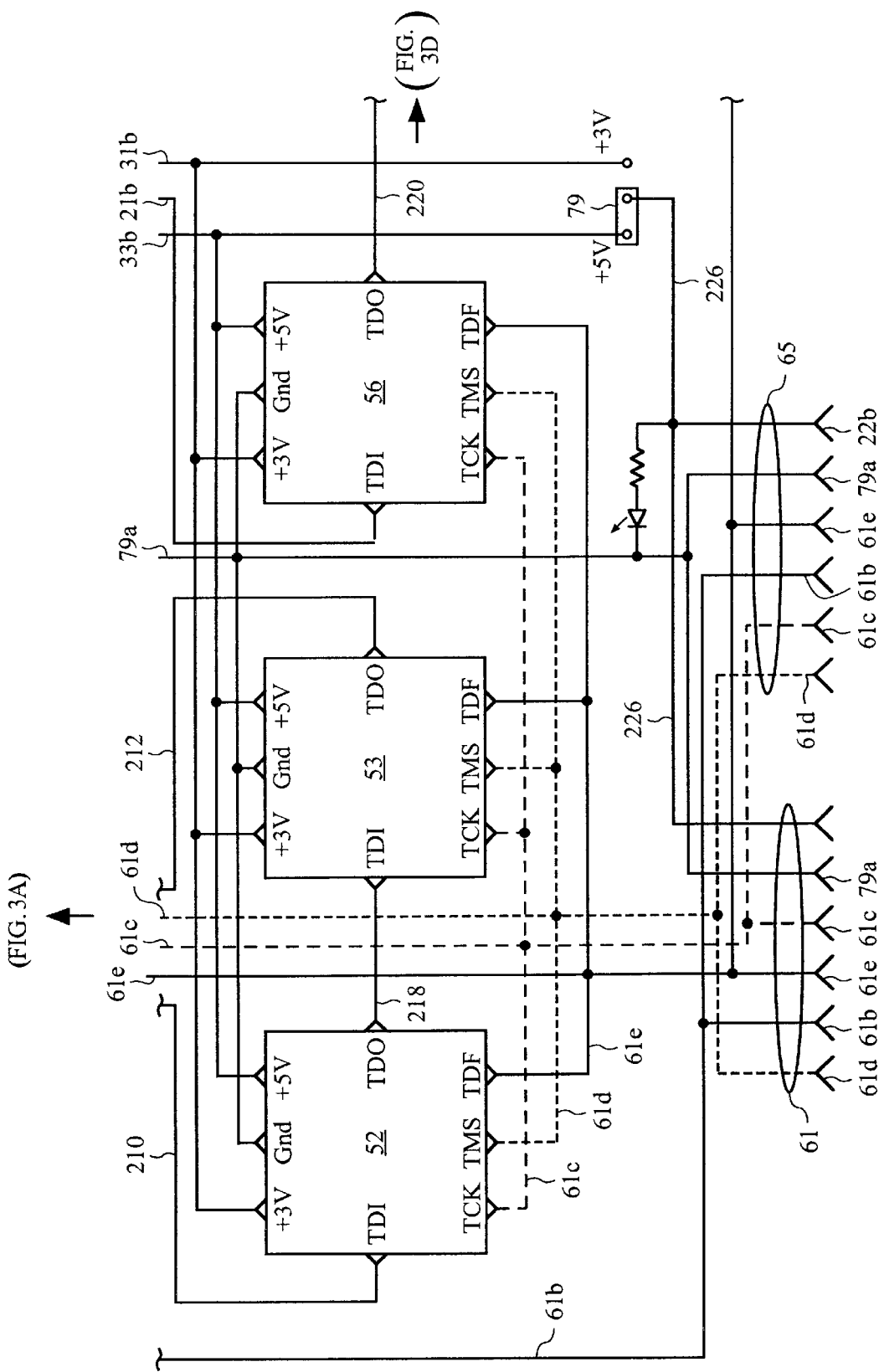
Figure 3C:
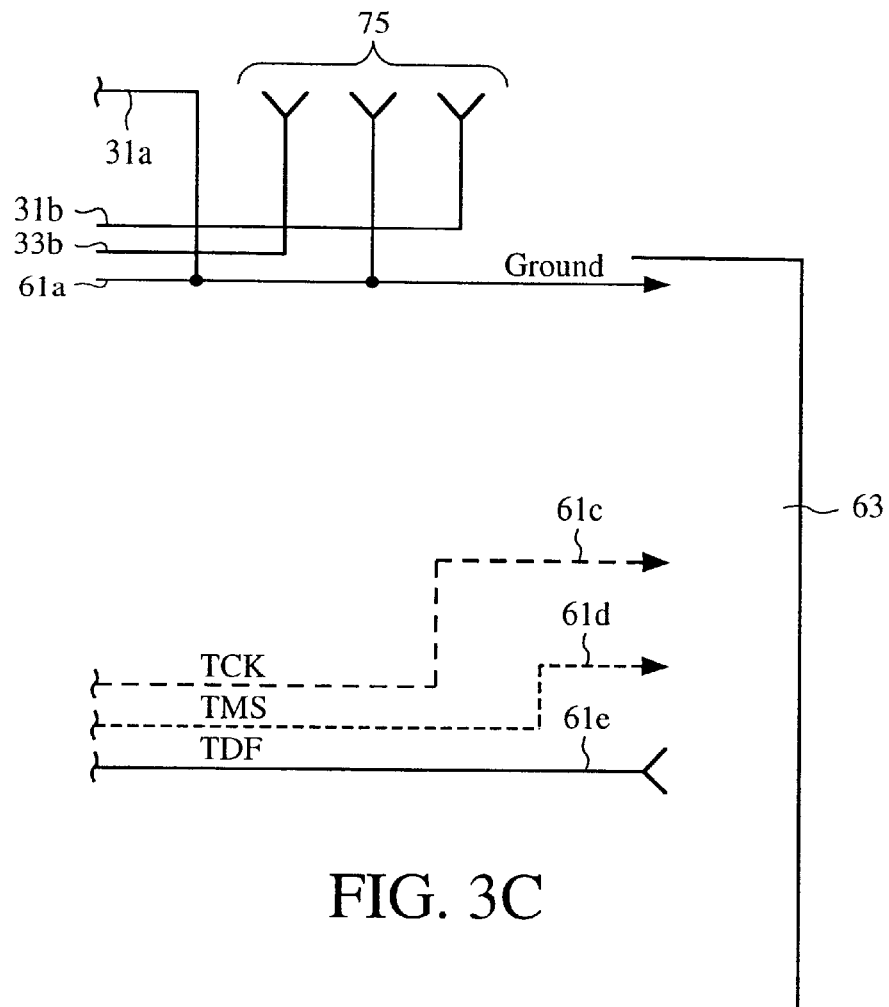
Figure 3D:
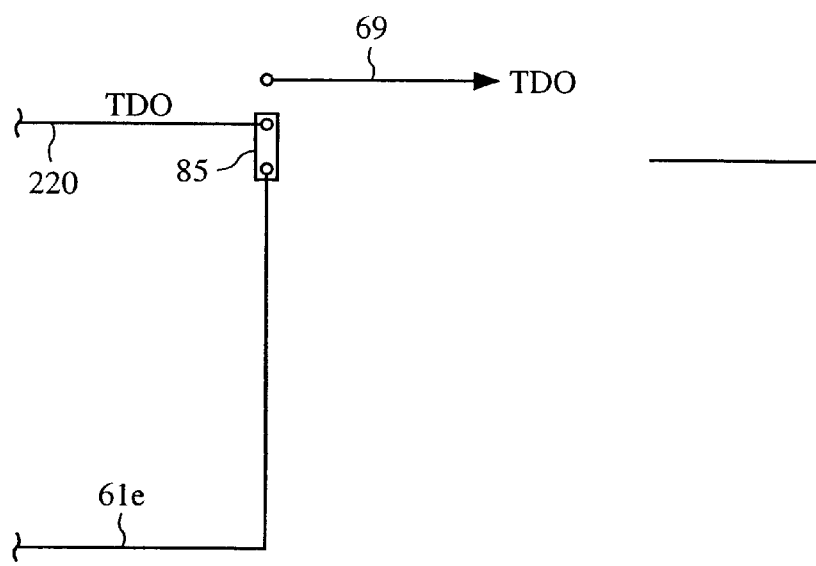
Figure 4:
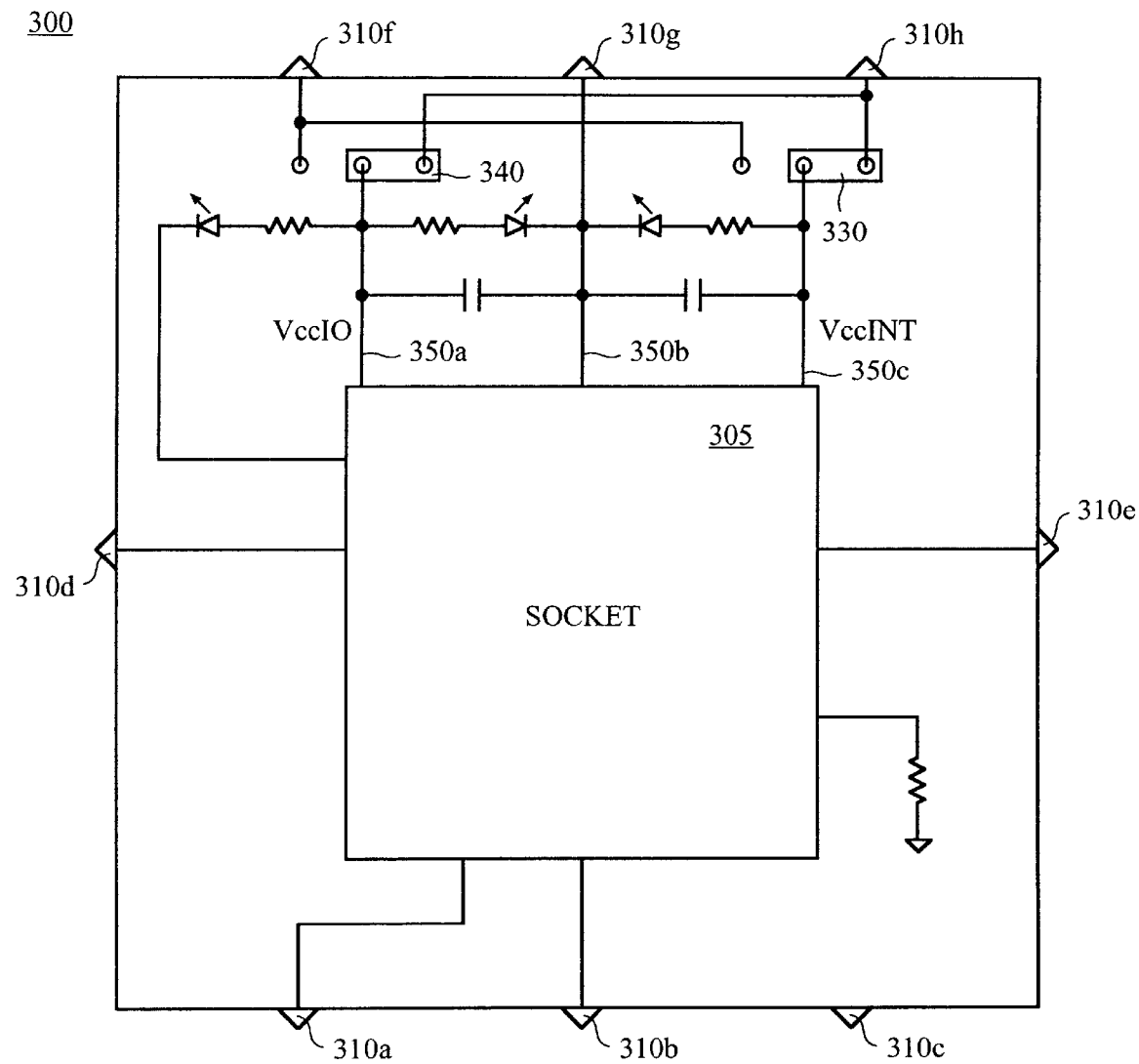
FIG. 4 is a schematic diagram of a generic modular IC interface card of the present invention.

FIG. 4 is a schematic diagram of a generic modular IC interface card 300 of the present invention including a socket 305 which can receive any number of different chip packages. Each chip package receives a PLD. Thus, a PLD is inserted into the JTAG chain when its associated modular IC interface card 300 is connected onto a JTAG interface using pins 310a–310e (also referred to herein as standard interface 310). Pin 310a receives the TCK signal, pin 310b receives the TMS signal, pin 310d receives the TDI signal, and pin 310e provides the TDO signal. Pin 310c is reserved for supplying the last TDO output signal in the JTAG chain (i.e. the Test Data Final (TDF) signal) to cable connector 61/65 and therefore is not coupled to socket 305 (as explained in greater detail in reference to FIGS. 3D and 7, the TDF signal is provided by a terminator card or the last JTAG interface in a fully occupied interface board). Pins 310*f*, 310*h*, and 310*g* receive the 3.3V, 5V, and ground voltage, respectively.

In many cases, a PLD is driven with different voltages for its input/output (I/O) circuitry and for its internal circuitry. Therefore, in one embodiment of the present invention, jumper 340 is coupled to line 350*a* which supplies power to the I/O circuitry of the PLD within socket 305, and is selectively coupled to pin 310*f* which provides 3.3V or pin 310*h* which provides 5V. In a similar manner, jumper 330 is coupled to line 350*c* which supplies power to the internal circuitry (e.g., non-I/O circuitry) of the PLD within socket 305, and is selectively coupled to pins 310*f* or 310*h*. Thus, either 3.3V or 5V can also be supplied to the internal circuitry of the PLD. An external voltage can be applied to the I/O circuitry by removing jumper 340 completely and connecting the external voltage to line 350*a*. An external voltage supply level can be applied to the internal circuit (line 350*c*) in a similar manner.

Figure 5A:
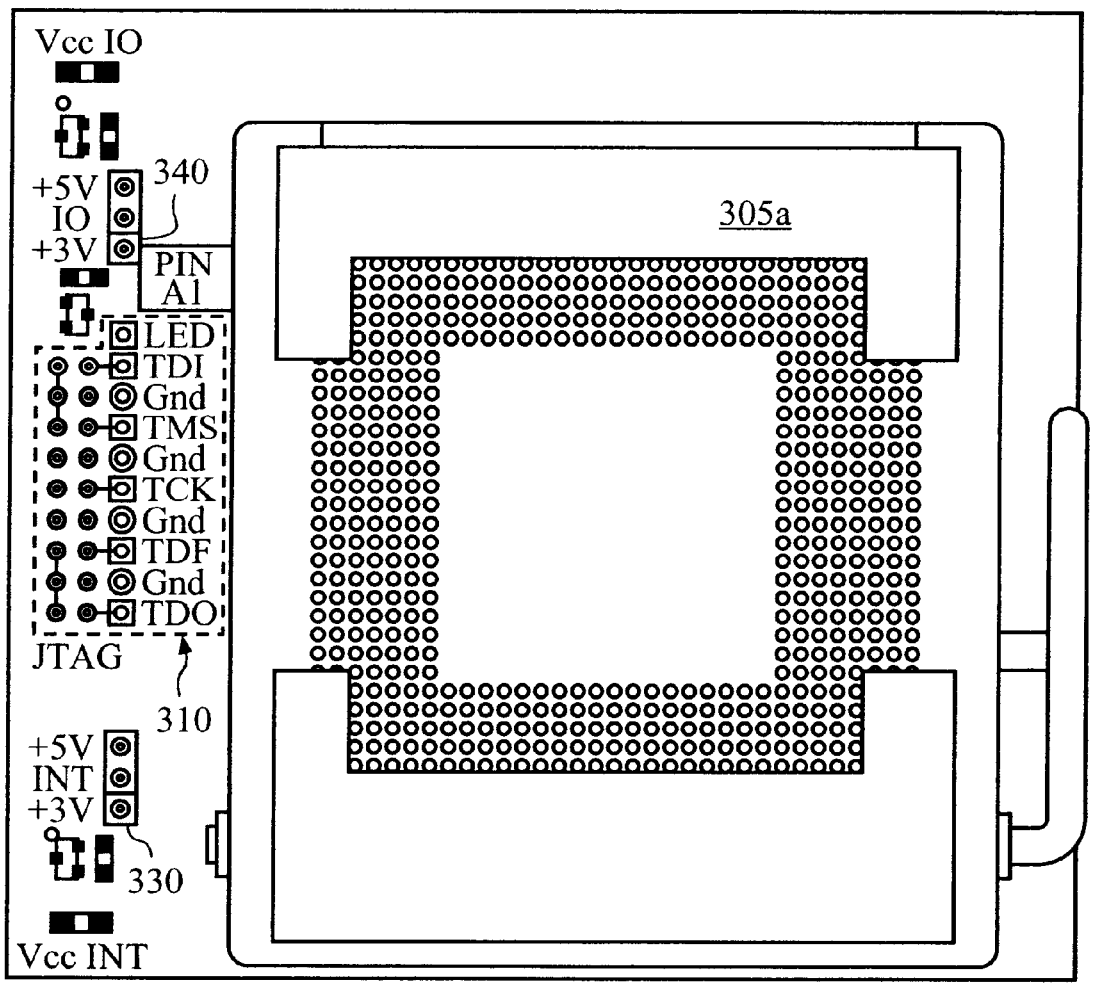
FIGS. 5A and 5B illustrate top and bottom views of a first embodiment of a modular IC interface card in accordance with the present invention.
Figure 5B:
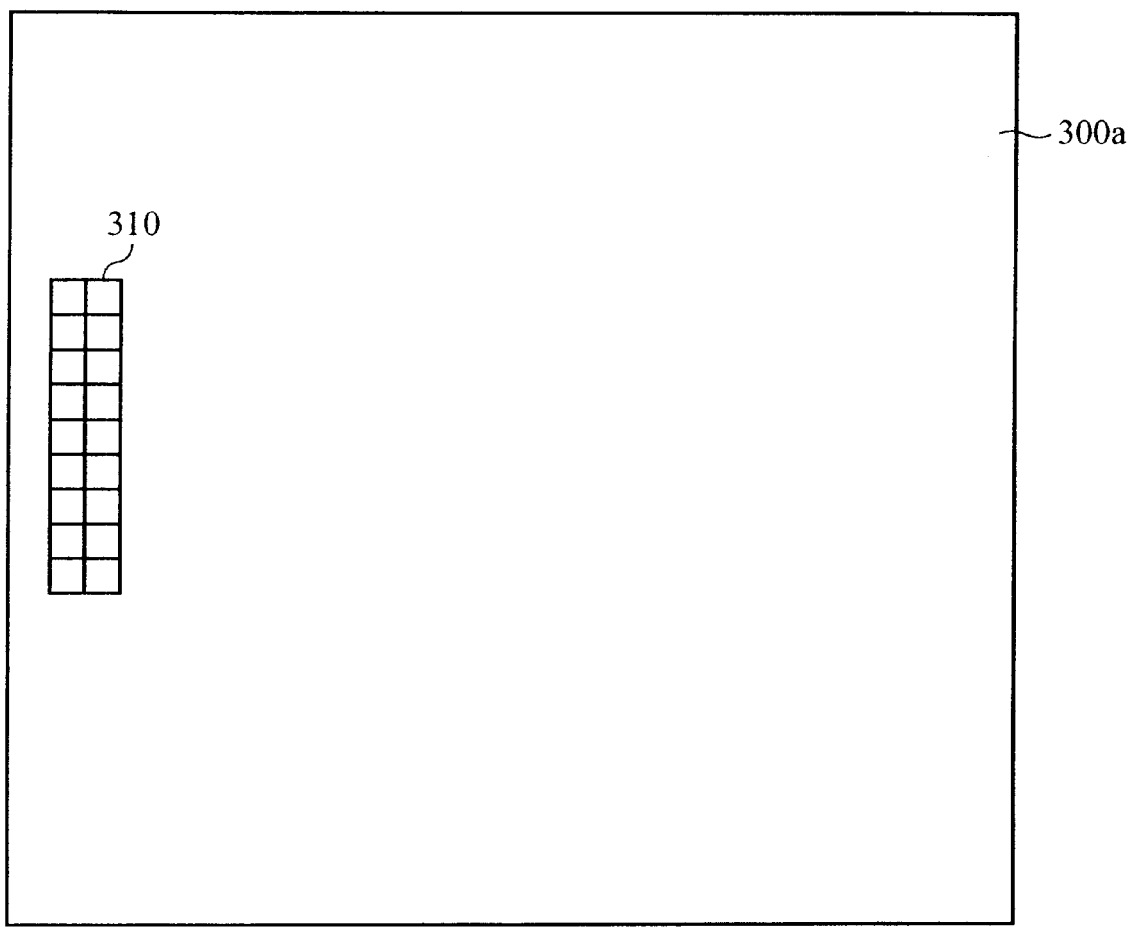

FIG. 5A illustrates a top view of one embodiment of a modular IC interface card 300*a* for one type of chip package. In card 300*a*, socket 305*a* is a ball grid array type socket (BGA) which receives a PLD of the same BGA package type. In one embodiment, a standard interface 310 uses top-mounted probe pins including: TDI, GND, TMS, TCK, TDF, and TDO. In this embodiment, a female 18 pin connector 310 (FIG. 5B) located directly underneath the above-mentioned probe pins, is adapted to couple to any one of JTAG interfaces 51–56 of interface board 100 (FIG. 2).

Figure 6:
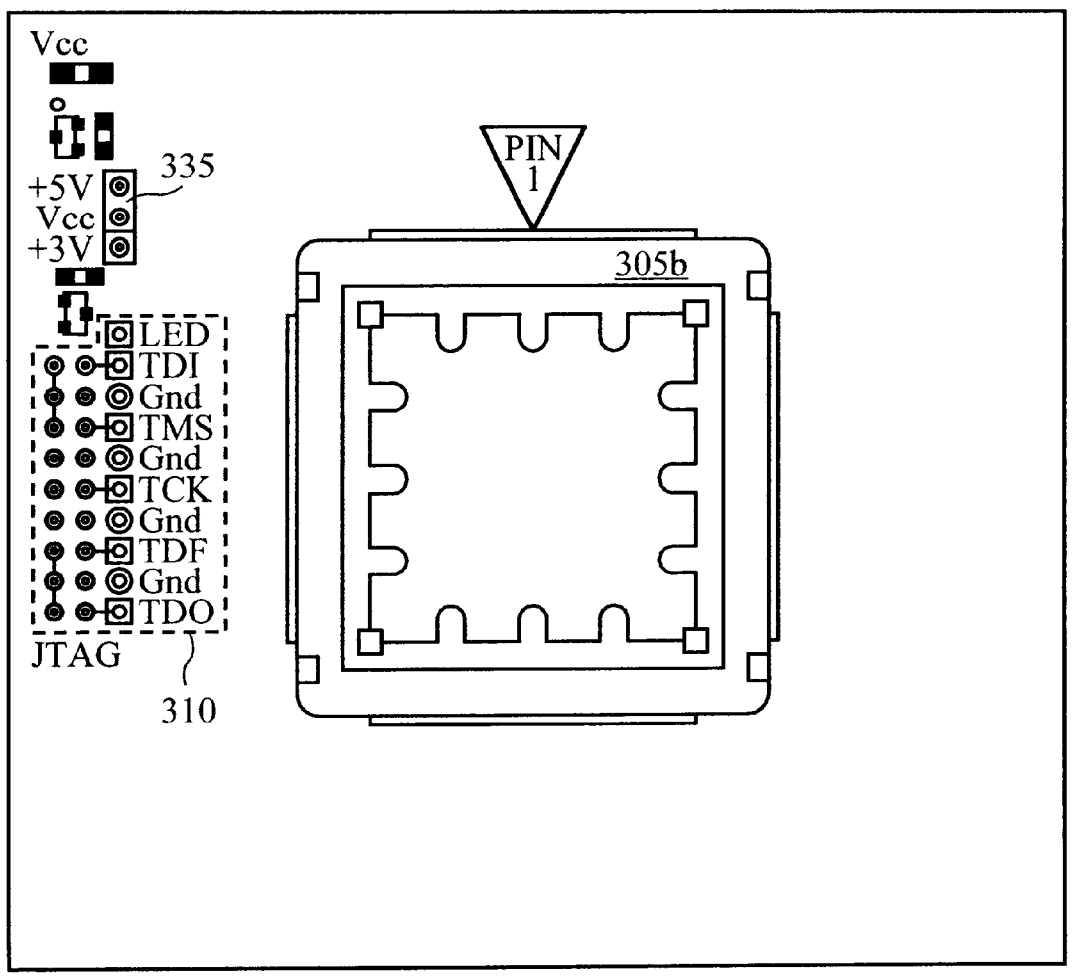
FIG. 6 illustrates a top view of a second embodiment of a modular IC interface card in accordance with the present invention.

FIG. 6 illustrates a top view of a second embodiment of a modular IC interface card 300*b* in accordance with the present invention for a second type of chip package. In card 300*b*, socket 305*b* is a plastic leaded chip carrier (PLCC) type socket which receives a PLD of the same PLCC package type. Standard interface 310 includes the top-mounted probe pins and the female connector described in reference to FIGS. 5A and 5B. Note that card 300*b* includes an adaptor 335 which replaces jumpers 330 and 340 (FIG. 5A, for example). Adaptor 335 is used for devices which do not have different voltages for their I/O and internal circuitry.

Note that in accordance with the present invention package types of different pin counts and different package types may be used. Thus, a socket 305 may be adapted to receive a very thin plastic quad flat pack (VQ), a plastic quad flat pack (PQ), a thin plastic quad flat pack (TQ), a heat sink plastic quad flat pack (HQ), or a ball grid array (BGA). Exemplary pin counts number from 44 to 208. It is appreciated that any modular IC interface card can be inserted into any of JTAG interfaces 51–56 of JTAG interface board 100 of the present invention.

Terminator Card

Figure 7:
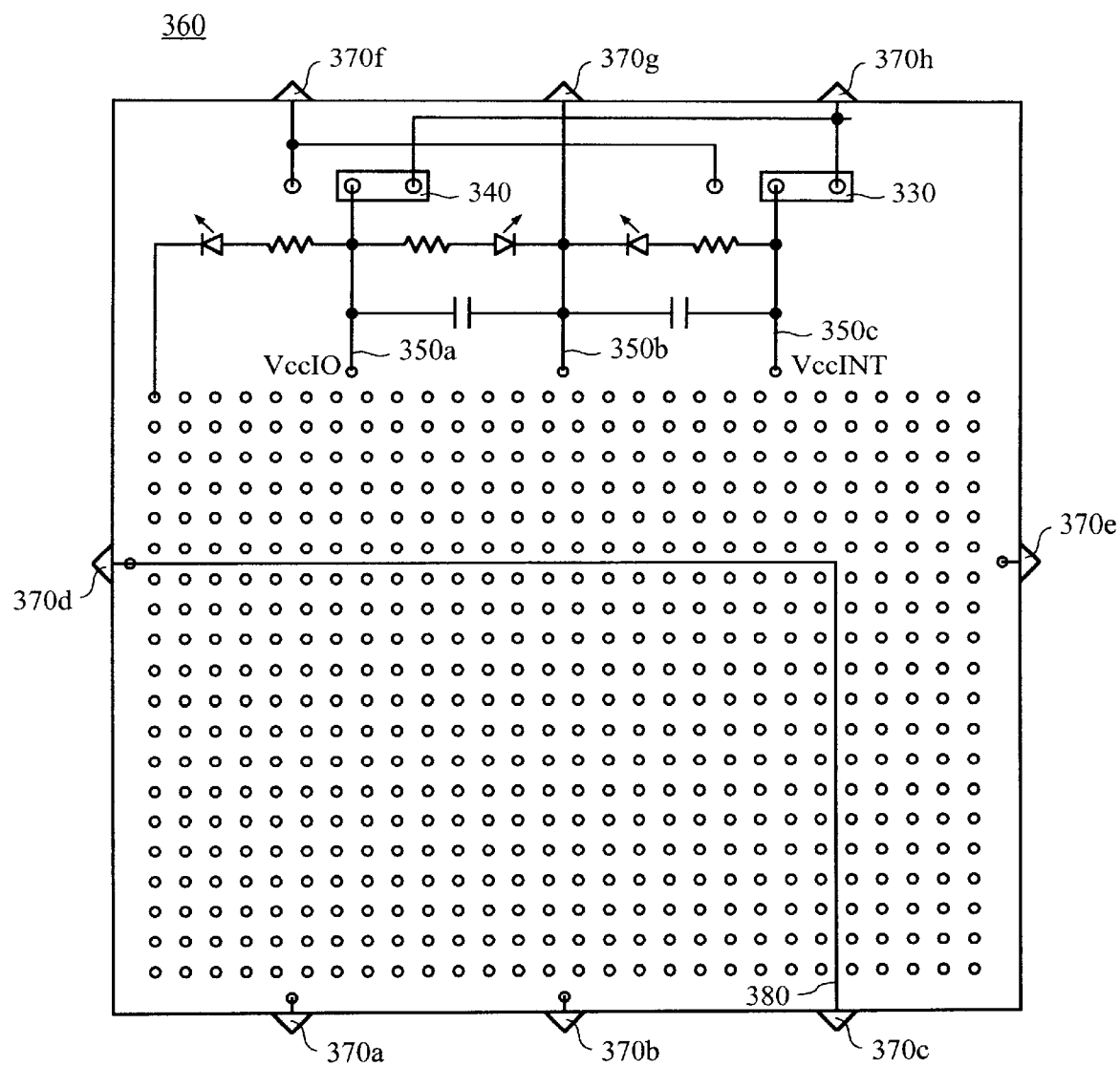
FIG. 7 shows a schematic diagram of a terminator card of the present invention.

In accordance with the present invention, the TDO signal from one PLD is provided as the TDI signal of the next PLD in the JTAG chain. The TDO signal of the last PLD in the JTAG chain is routed back as the test data final (TDF) signal to cable connectors 61 and 65 (and thereafter to the computer system for analysis). To provide this signal routing capability in instances where less than all interface stations are occupied, a terminator card 360, illustrated schematically in FIG. 7, is inserted into the JTAG interface station following the last PLD in the JTAG chain. For example, if a JTAG chain is implemented with interface board 100 having modular IC interface cards plugged into interface stations 101–104, then terminator card 360 is plugged into interface station 105.

In the embodiment shown in FIG. 7, terminator card 360 includes a standard interface 370 (including pins 370*a*–370*h*), as well as jumpers 340 and 330 (see modular IC interface card 300 of FIG. 4). Because terminator card 360 provides only routing functionality, pin 370*d* (receiving the TDO signal) and pin 370*c* (providing the TDF signal) are the only required pins on terminator card 360. Note that terminator card 360 contains a connector (not shown) located on the bottom side (see, for example, FIG. 5B) for mating with one of JTAG interfaces 51–56 of interface board 100.

Using the above-described configuration, only one terminator card 360 is required for a JTAG chain in accordance with the present invention. On the other hand, if all six interface stations 101–106 of interface board 100 contain PLDs, then terminator card 360 is not required because the TDO pin of JTAG interface 56 (FIG. 3B) can instead be coupled to TDF line 61*e* via line 220 and jumper 85 (FIG. 3D).

Figure 8:
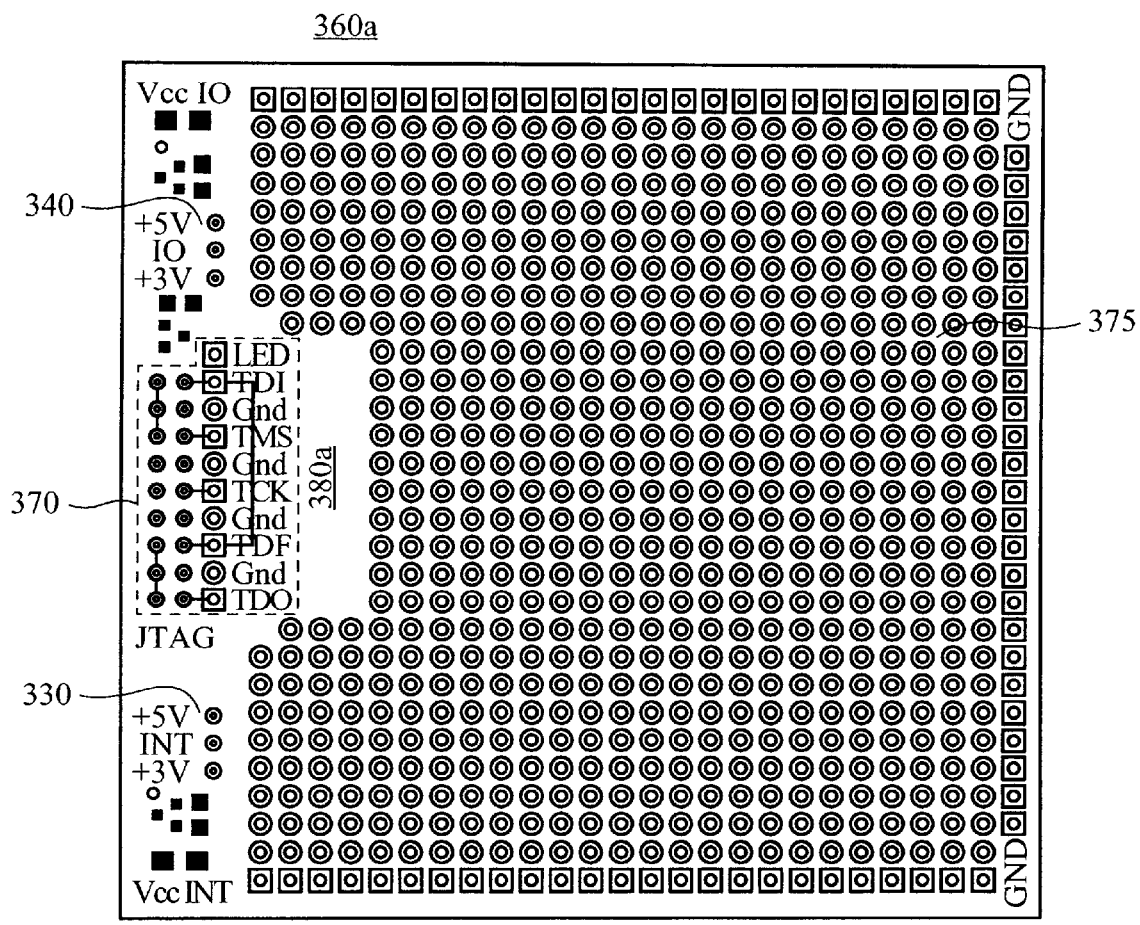
FIG. 8 illustrates a top view of one embodiment of a terminator card of the present invention.

FIG. 8 illustrates a top view of one embodiment of terminator card 360*a* in which line 380 (FIG. 7) is implemented with a jumper 380*a*. Terminator card 360*a* includes a circuit prototype area 375 in which an IC package can be mounted. In this manner, terminator card 360*a* can be used as a modular IC interface card with an IC package (of any type and pin count). If an IC package is mounted in region 375, jumper 380*a* is disconnected.

Single Interface Board

FIG. 9A illustrates a first exemplary configuration 400 of interface board 100 of the present invention in which one modular IC interface card 300*a* (FIG. 5A) is inserted into JTAG interface 51 (of interface station 101), one terminator card 360*a* (FIG. 8) is inserted into JTAG interface 52 (of interface station 102), and interface stations 103–106 are unused. In configuration 400, only one PLD, inserted into socket 305*a*, is within the physical JTAG chain implemented on interface board 100. During programming in configuration 400, JTAG signals (the TDI, TCK, and TMS signals) are applied to cable connector 61 (see FIG. 1) from the computer system (not shown) using cable 10. Terminator card 360*a* routes the TDO signal from JTAG interface 51 (because JTAG interface 51 is the last in the chain, this TDO signal becomes the TDF signal) back to cable connector 61 via line 61*e* (FIG. 3A). Cable connector 61 directs the TDF signal back to the computer system using cable 10.

Figures 2, 9B:
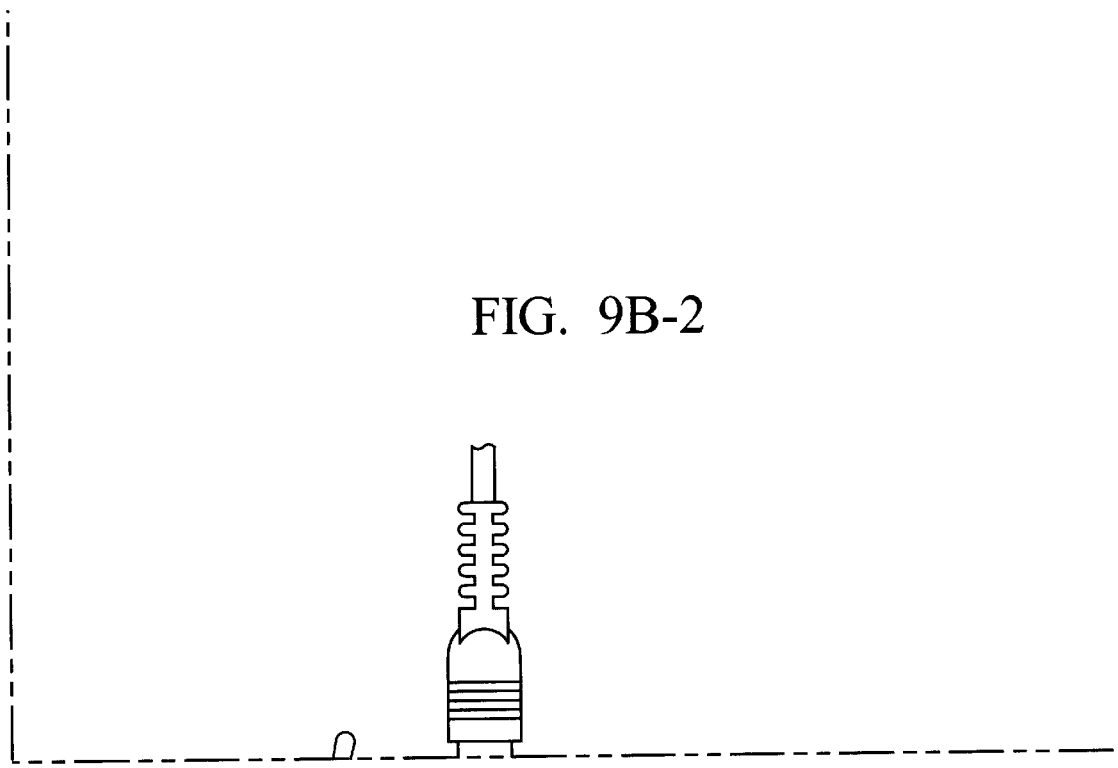
Figures 3, 9B:
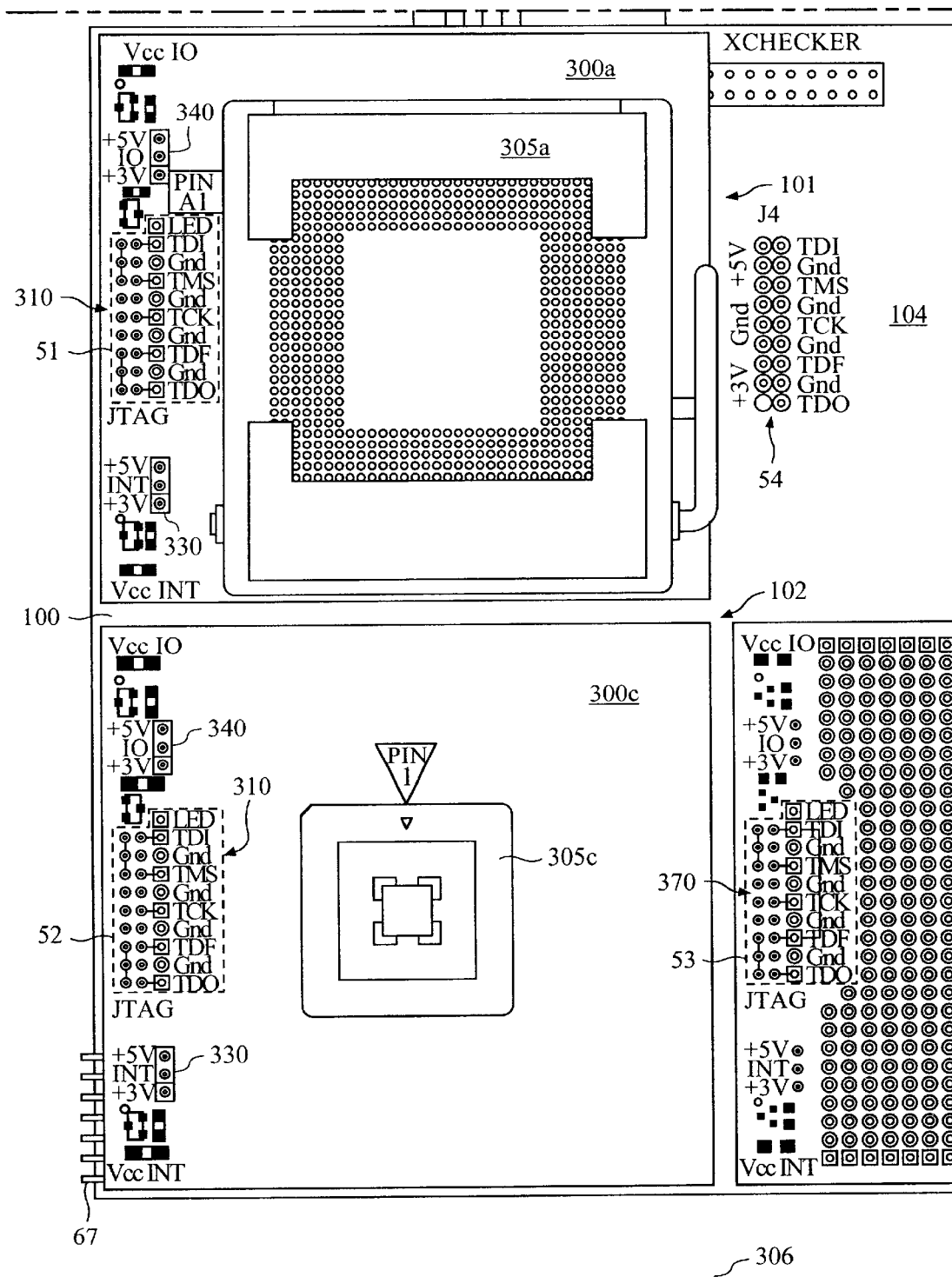
Figures 4, 9B:
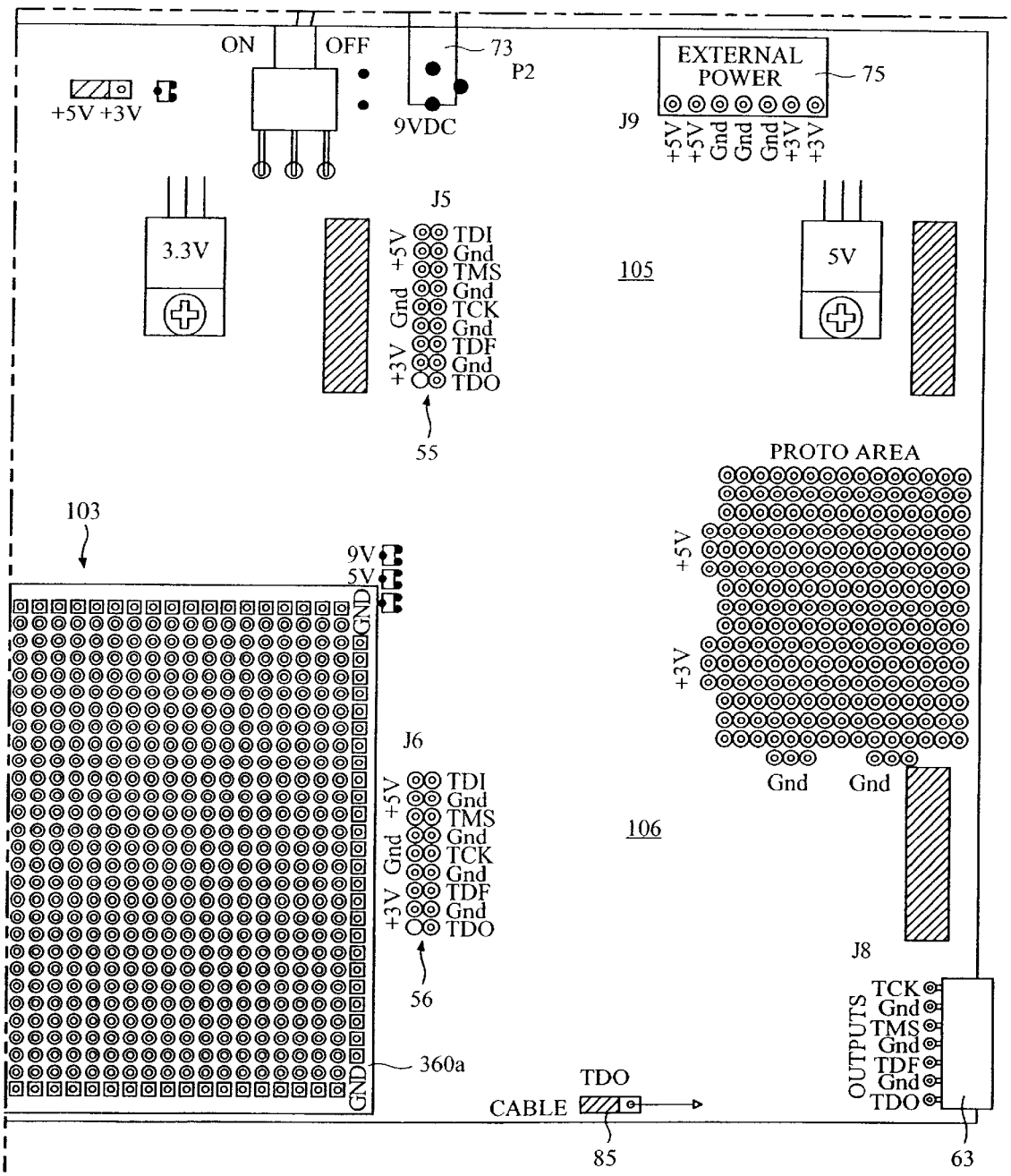

FIG. 9B illustrates a second exemplary configuration 410 of interface board 100. In configuration 410, a first modular IC interface card 300*a* (FIG. 5A) is inserted into JTAG interface 51, a second modular IC interface card 300*c* (including a plastic leaded chip carrier socket 305*c* of the PC44 type) is inserted into JTAG interface 52, modular terminator card 360*a* (FIG. 8) is inserted into JTAG interface 53, and interface stations 104–106 are unused. In operation, a first PLD is inserted into socket 305*a* and a second PLD is inserted into socket 305*c*, thereby providing two programmable IC devices within the JTAG chain. Terminator card 360*a* routes the TDO signal from JTAG interface 52 (i.e. the TDF signal) back to cable connector 61/65 via line 61*e*.

Figures 1, 9C:
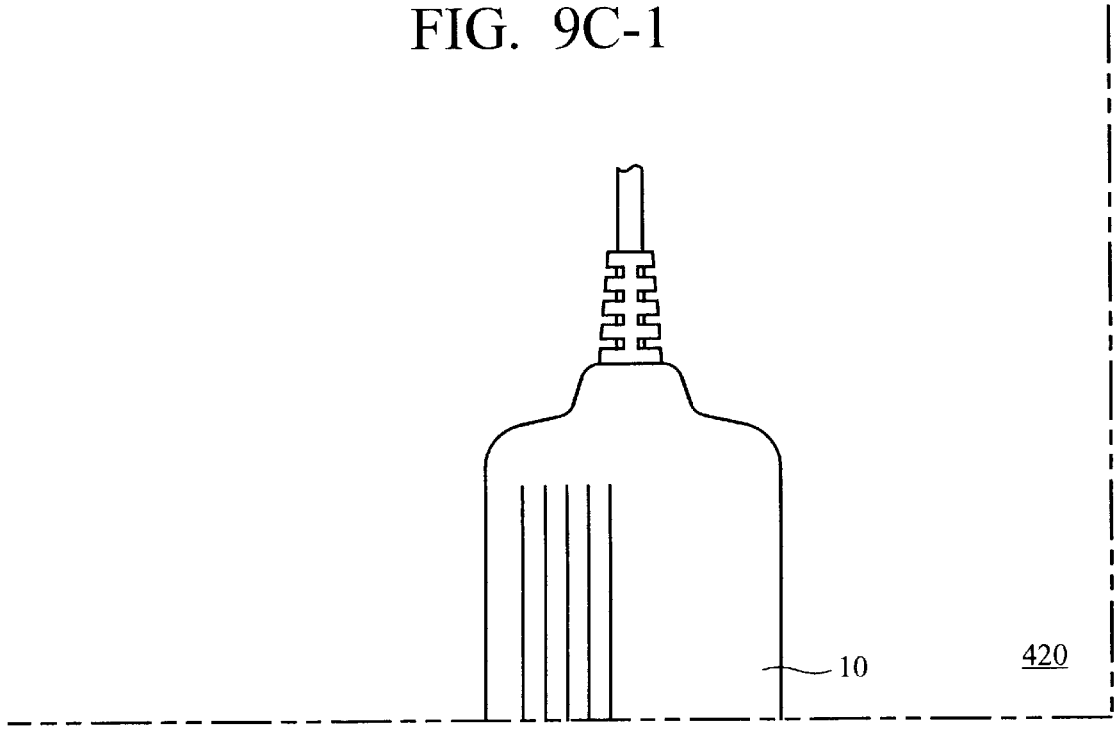
Figures 2, 9C:
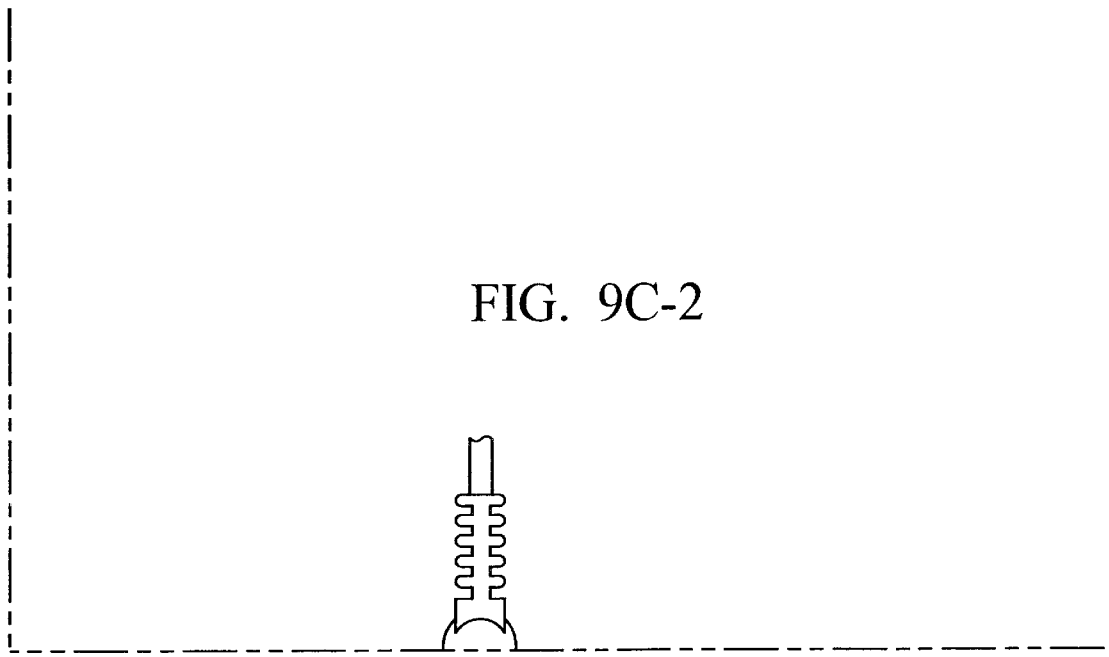
Figures 3, 9C:
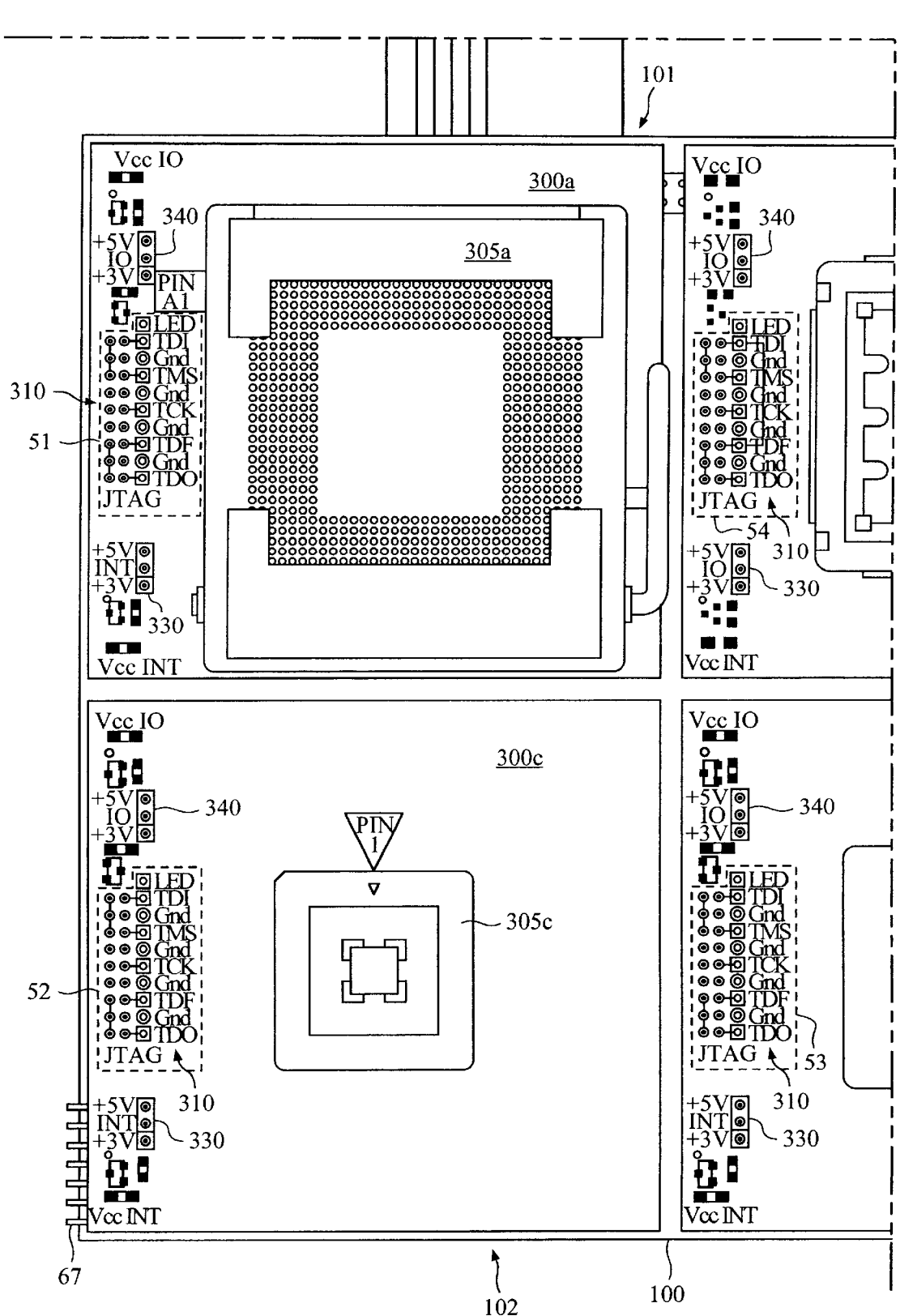
Figures 4, 9C:
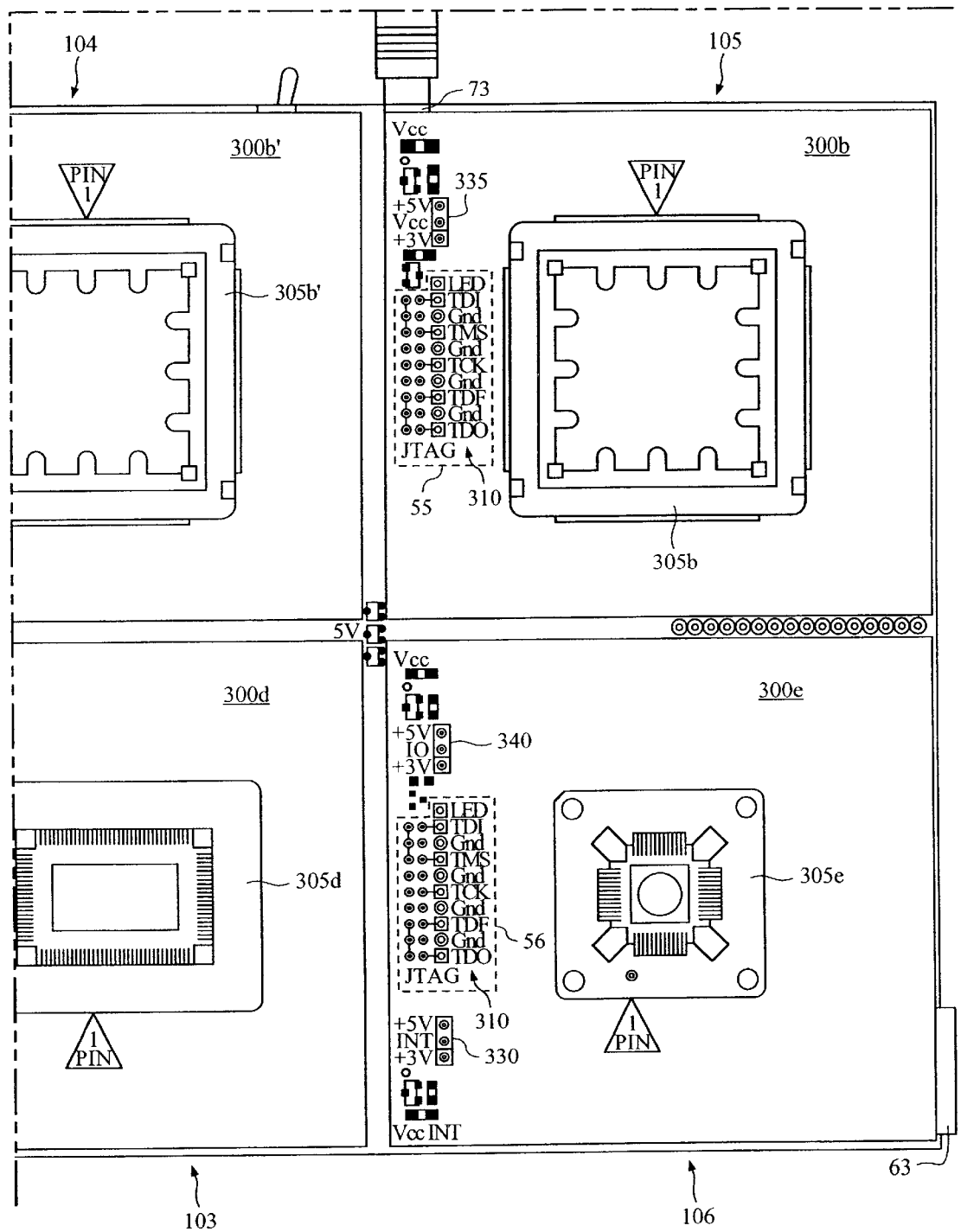

FIG. 9C illustrates a third exemplary configuration 420 of interface board 100 in which six modular IC interface cards 300*a*, 300*c*, 300*d*, 300*b*', 300*b*, and 300*e* are respectively inserted into JTAG interfaces 51–56. First and second modular IC interface cards 305*a* and 300*c* are the same as described in reference to FIG. 9B. A third modular IC interface card 300*d* uses a plastic quad flat pack socket 305*d* of the PQ100 type; a fourth modular IC interface card 300*b*' uses a plastic leaded chip carrier socket 305*b*' of the PC84 type; a fifth modular IC interface card 300b uses a plastic leaded chip carrier socket 305b' of the PC84 type; and a sixth modular IC interface card 300e uses a very thin quad flat pack of the VQ44 type. In operation, PLDs are inserted into sockets 305a, 305b', 305b, 305c, 305d, and 305e, thereby providing six programmable IC devices within the JTAG chain. Because no other interface board is cascaded to interface board 100, jumper 85 is placed to couple lines 220 and 61e (FIG. 3D), thereby transferring the TDO signal (now TDF signal) from JTAG interface 56 back to cable connector 61/65.

Multiple Interface Boards

Figures 10, 10A:
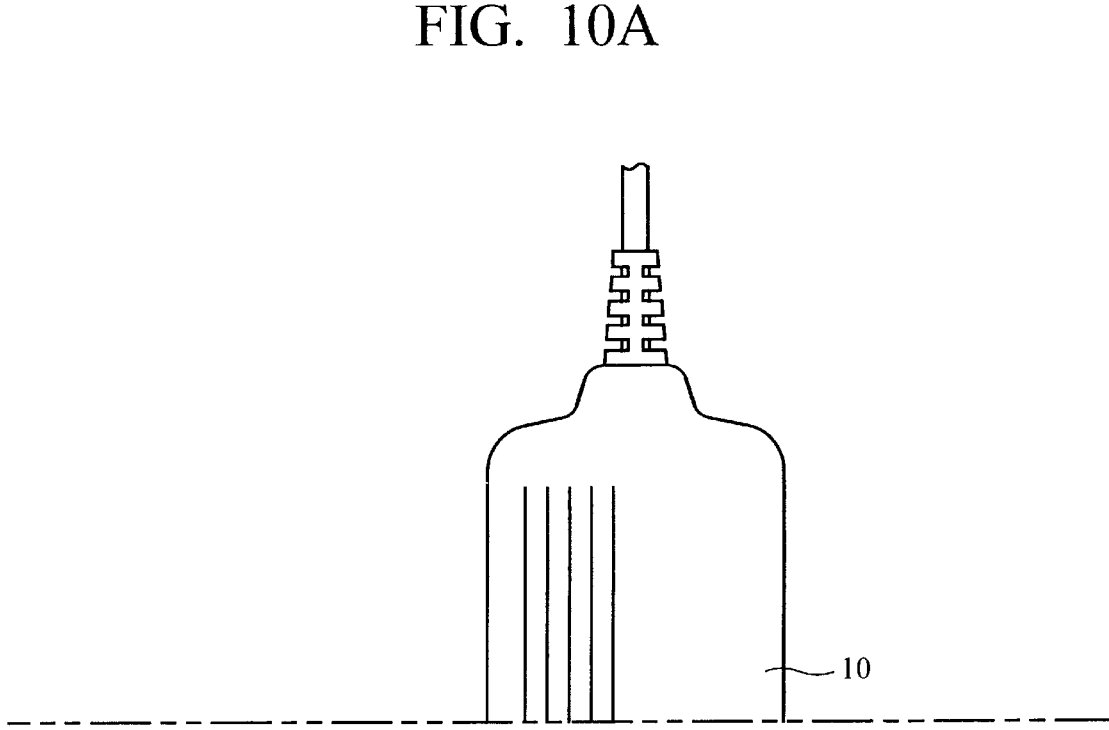
FIG. 10 illustrates two interface boards coupled to form one JTAG chain.
Figure 10B:
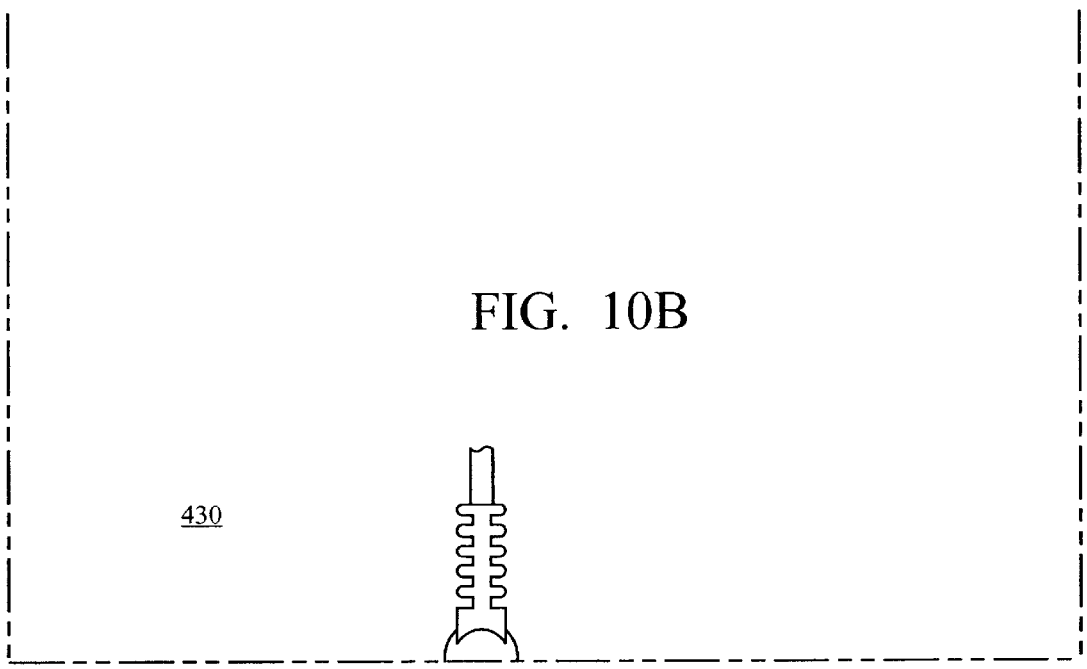
Figure 10C:
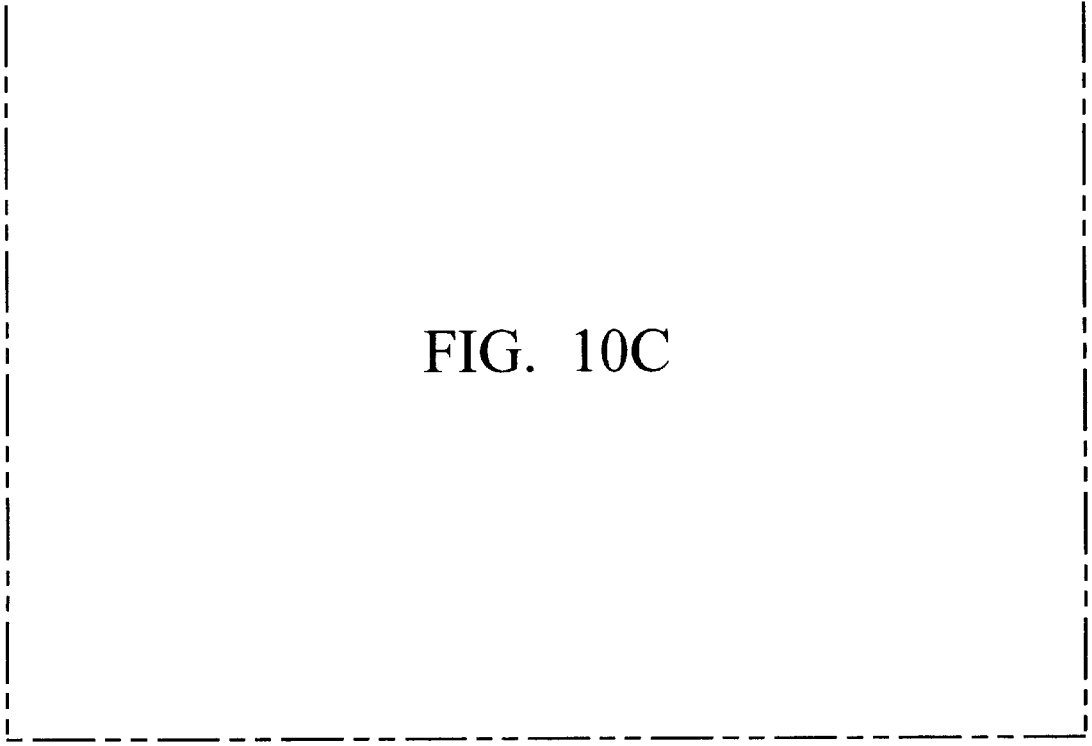
Figure 10D:
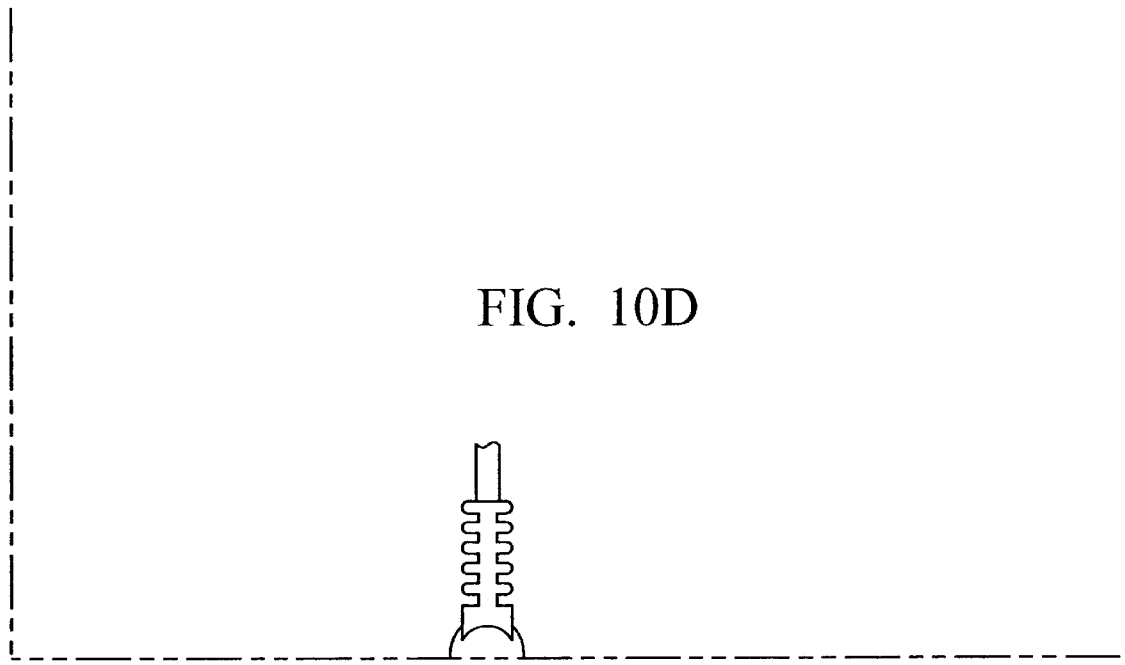
Figure 10E:
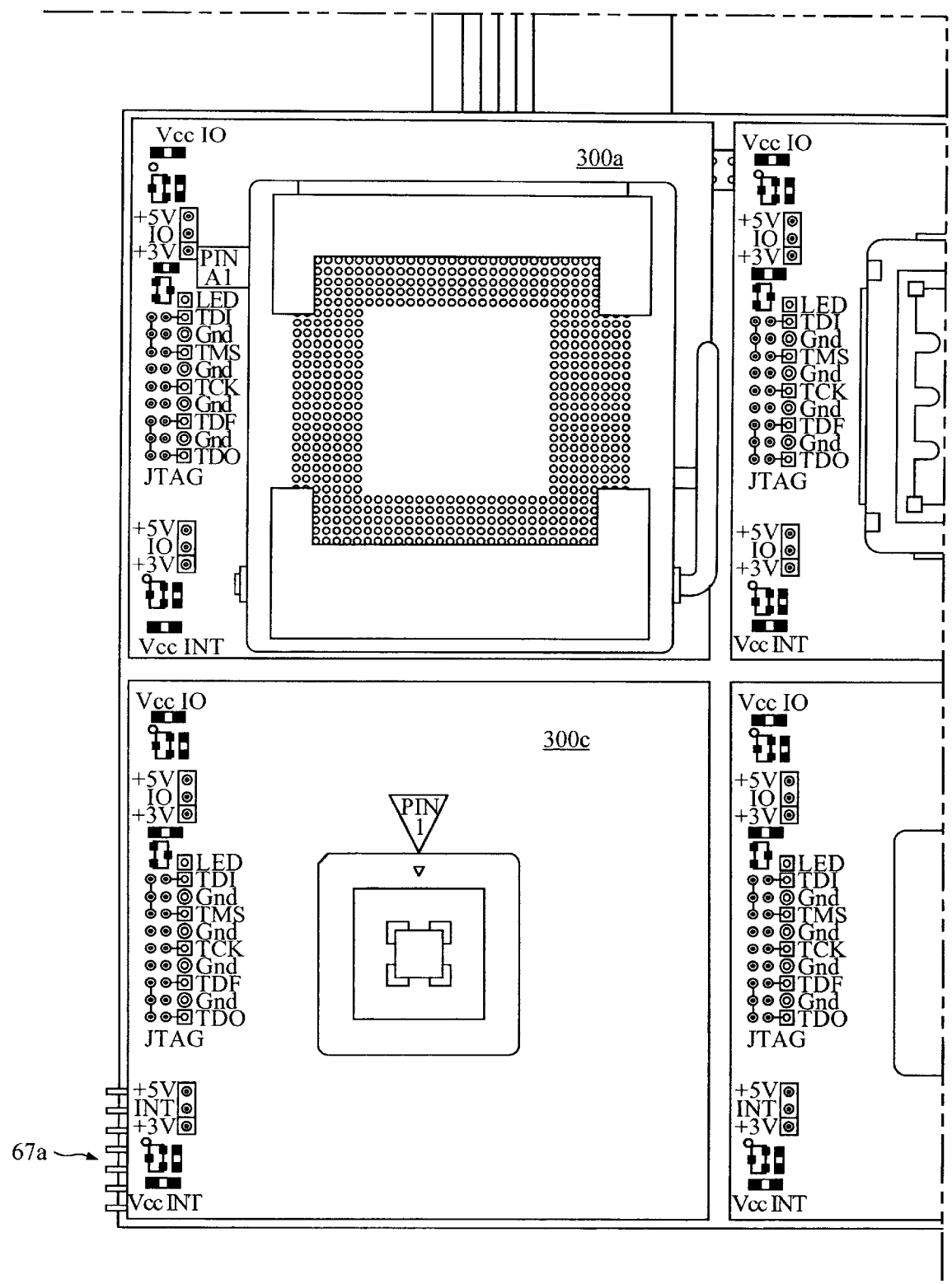
Figure 10F:
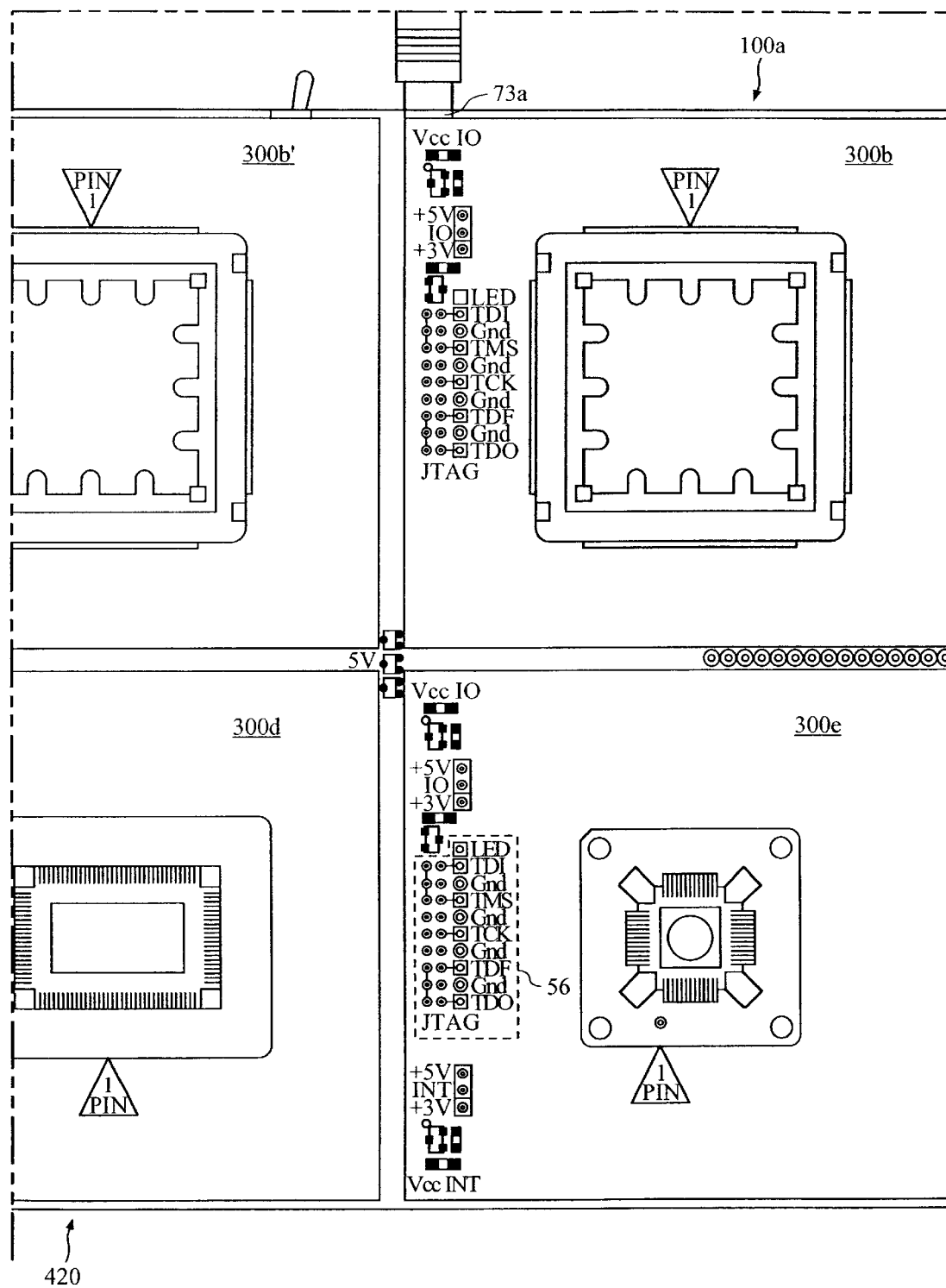
Figure 10G:
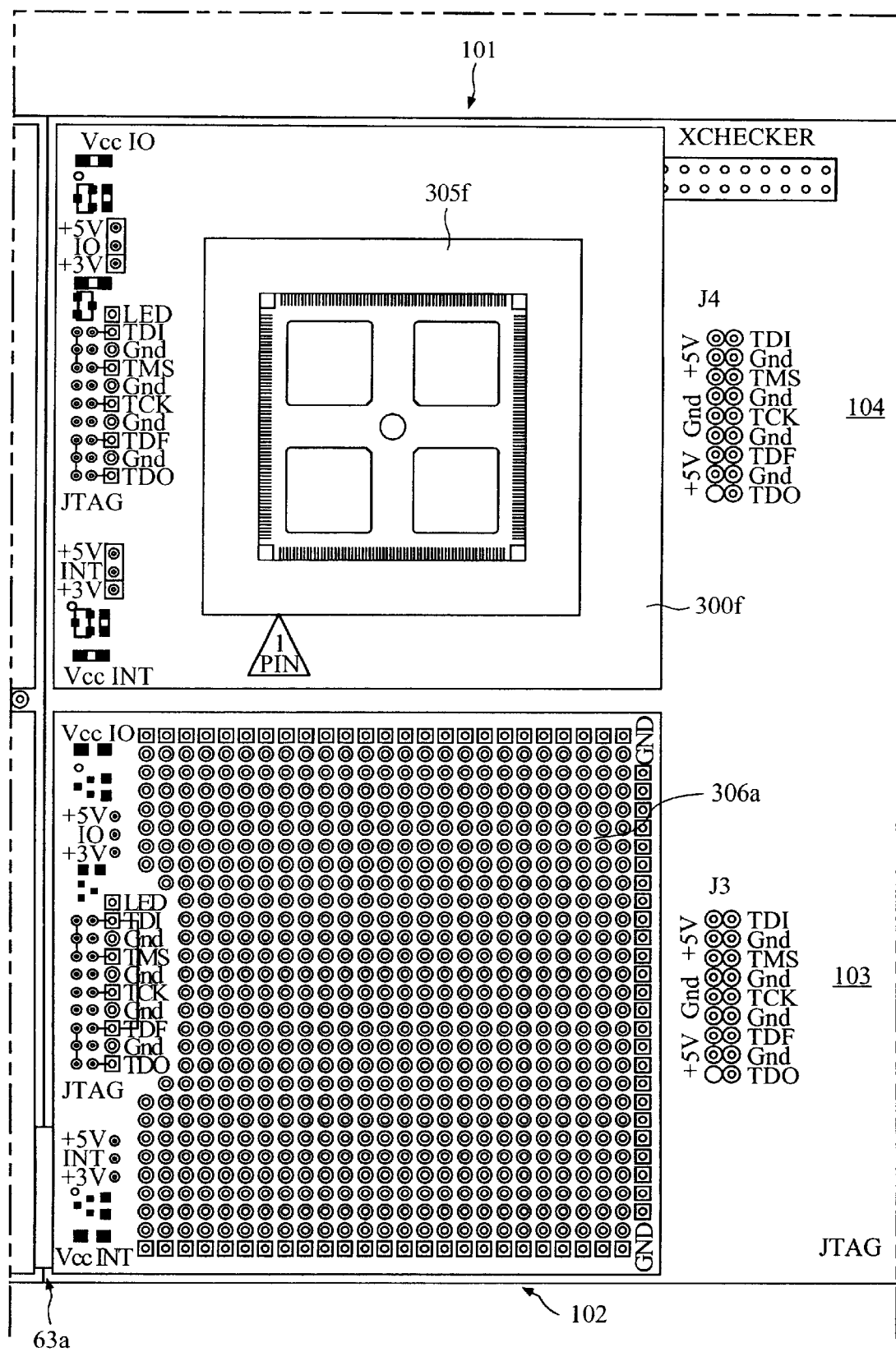
Figure 10H:
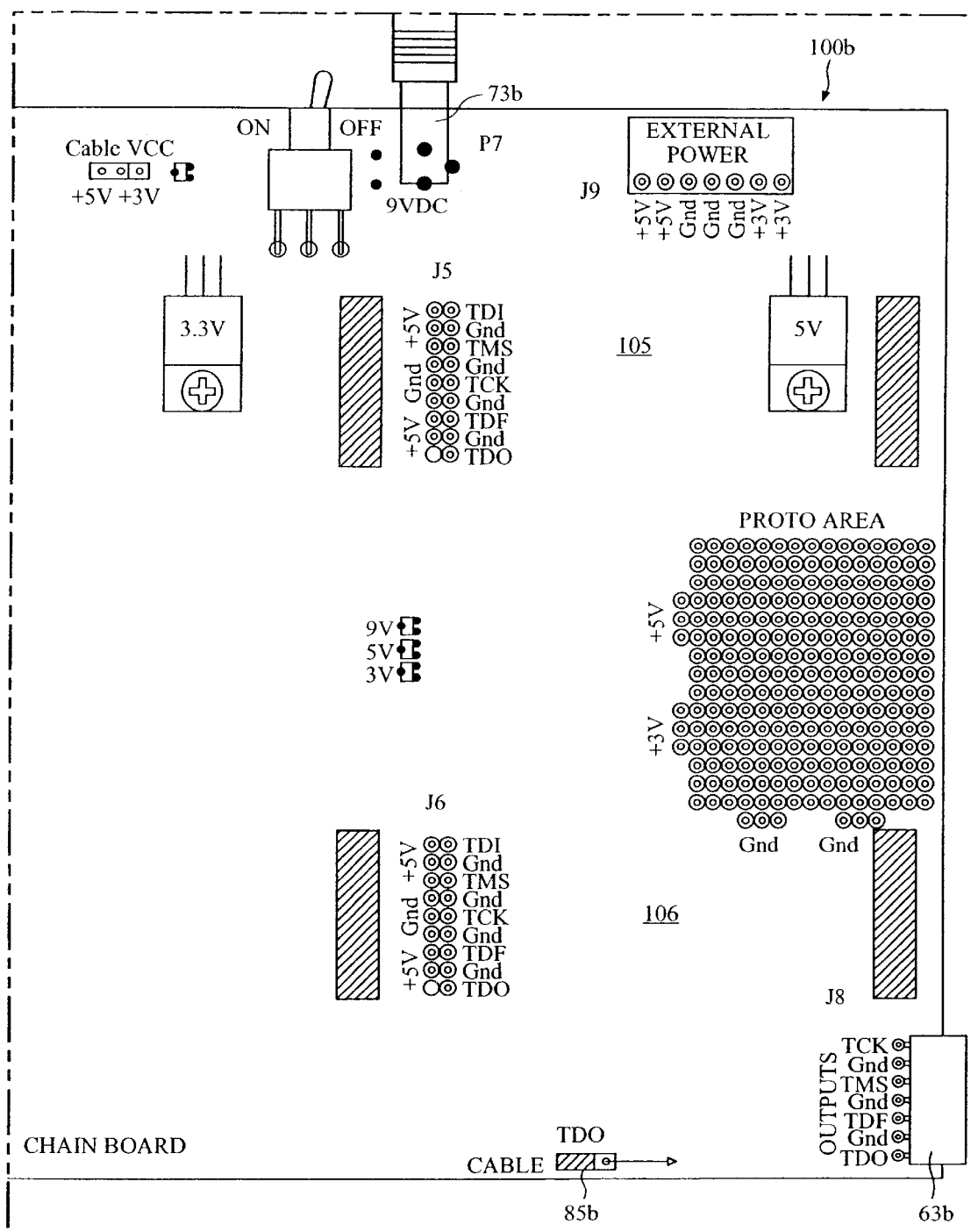

To create JTAG chains of devices longer than the number of interface stations (e.g., six) on one interface board, multiple interface boards are connected using an output cascade connector of the upstream interface board and an input cascade connector of the next downstream interface board. In FIG. 10, an exemplary configuration 430 includes two interface boards 100a and 100b connected to form one JTAG chain having seven PLDs. The first or "upstream" interface board 100a is identical to configuration 420 (FIG. 9C), whereas the second or "downstream" interface board 100b contains a modular IC interface card 300f (including a heat sink plastic quad flat pack socket 305f of the HQ208 type) inserted into interface station 101 and a terminator card 360a inserted into interface station 102.

In configuration 430, output cascade connector 63a of interface board 100a is connected to an input cascade connector (not shown) of interface board 100b. Specifically, lines 61a, 61c, 61d, 61e, and 69 (as shown in FIGS. 3C and 3D) of interface board 100a are respectively coupled to lines 61a, 61c, 61d, 61e, and 61b (as shown in FIG. 3A) of interface board 10b. This connection transfers the TCK, TMS, and TDO signals, as well as the ground voltage from the upstream interface board to the downstream interface board. This connection also transfers the TDF signal from the downstream interface board (provided by terminator card 360a) to the upstream interface board and thus to cable 10 via cable connector 61/65 (see line 61e of FIGS. 3A, 3B, and 3C). In one embodiment, each interface board is separately coupled to the universal power supply (FIG. 1). Alternatively, the voltages can be provided from one power supply to all interface boards via connector 75 (in parallel).

Note that jumper 85 (FIG. 3D) is switched to a position labeled CABLE if JTAG interface station 106 is occupied with a modular IC interface card and either is the only interface board used in a JTAG chain or is the last downstream interface board in a series of interface boards. In this configuration, line 220 (providing the TDO signal) of interface station 106 is coupled to line 61e (providing the TDF signal to cable connector 61/65). Jumper 85 is switched to a position labeled TDO if JTAG interface station 106 is occupied with a modular IC interface card and is not the only interface board used in a JTAG chain nor is the last downstream interface board in a series of interface boards. In this configuration, line 220 (providing the TDO signal) of interface station 106 is coupled to line 69 (which transfers this TDO signal as the TDI signal to line 61b of input cascade connector 67). In all other instances, jumper 85 may be switched to either position, i.e. a "don't care" configuration.

While the present invention has been described in particular embodiments, it should be appreciated that the present invention should not be construed as limited by such embodiments, but rather construed according to the below claims.

What is claimed is:

1. A system for implementing a boundary scan chain, said system comprising:

an interface board comprising:
a connector for transferring boundary scan signals; and
a plurality of interfaces coupled in series in a predetermined order, and in parallel to receive a plurality of said boundary scan signals; and
at least one card comprising:
a socket for receiving an integrated circuit; and
a connector interface, coupled to said socket, for removably coupling with one of said plurality of interfaces.

2. The system of claim 1 wherein said connector is coupled to a Test Data Input (TDI) pin of a first interface, wherein a Test Data Output (TDO) pin of said first interface is coupled to a TDI pin of a second interface, and wherein a TDO pin of a last interface is selectively coupled to said connector.

3. The system of claim 1 further including a terminator card comprising:
a connector interface for removably coupling with one of said plurality of interfaces; and
a conductive path for providing the last TDO signal of said boundary scan chain as a Test Data Final (TDF) signal.

4. The system of claim 1 including a plurality of interface boards,
wherein a first interface board further comprises a cascade output connector,
wherein a second interface board further comprises a cascade input connector for coupling with said cascade output connector.

5. The system of claim 4 wherein said cascade connectors transfer said boundary scan signals between said first and second interface boards.

6. The system of claim 1 wherein said interface board further comprises:
a voltage input port for receiving a first voltage from a voltage supply;
a first voltage regulator coupled to receive said first voltage and for supplying a second voltage;
a second voltage regular coupled to receive said first voltage and for supplying a third voltage, wherein said second voltage and third voltage are supplied in parallel to said plurality of interfaces.

7. The system of claim 6 wherein said card further comprises:
means for supplying one of said second voltage and said third voltage to input/output circuitry of said socket; and
means for supplying one of said second voltage and said third voltage to internal circuitry of said socket.

8. The circuit as described in claim 1 wherein said connector comprises:
a first Joint Test Action Group (JTAG) connector for coupling with a first port of a computer system; and
a second JTAG connector for coupling with a second port of said computer system.

9. In combination, an interface board and one or more modular integrated circuit (IC) interface cards inserted into the interface board, wherein the combination comprises:
an interface board having a plurality of standard interfaces for receiving one or more modular integrated circuit (IC) interface cards;
one or more modular IC interface cards, each modular IC interface card having a socket of a particular package type for receiving an IC of the same package type and a connector interface, coupled to the socket, for a removable coupling with one of the standard interfaces of the interface board.

10. The combination according to claim 9, wherein the interface board further includes traces for providing certain standard signals, including a test mode select (TMS) signal and a test clock (TCK) signal, to all of the standard interfaces (and thus to the modular IC interface cards and ICs in the chain) in parallel.

11. The combination according to claim 10, wherein the interface board traces route other standard signals, including a test data input (TDI) signal and a test data output (TDO) signal, through the ICs in series.

12. The combination according to claim 11, wherein the TDO signal of one modular IC interface card becomes the TDI signal of the next modular IC interface card in the chain, the TDO signal of the last modular IC interface card in the chain is provided as a test data final (TDF) signal from the interface board back to a cable which communicates with a programming system.

13. The combination according to claim 12, further comprising a terminator card and wherein if less than the maximum number of modular IC interface cards are inserted into the interface board, the terminator card is inserted into the standard interface following the last modular IC interface card of the chain and wherein the terminator card provides a test data final (TDF) signal.

14. The combination according to claim 9, wherein the interface board further comprises an output cascade connector that can be coupled to an input cascade connector of another interface board for facilitating the transfer of standard signals between the interface boards, whereby any number of interface boards can be coupled in series to expand the size of the physical chain.

15. The combination according to claim 9, wherein each modular IC interface card has a socket of a different package type.

* * * * *